US012610861B2

(12) United States Patent
Lee

(10) Patent No.: US 12,610,861 B2
(45) Date of Patent: Apr. 21, 2026

(54) DISPLAY DEVICE AND METHOD OF MANUFACTURING THE SAME

(71) Applicant: Samsung Display Co., LTD., Yongin-si (KR)

(72) Inventor: Dong Hyun Lee, Asan-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 714 days.

(21) Appl. No.: 17/887,645

(22) Filed: Aug. 15, 2022

(65) Prior Publication Data

US 2023/0154906 A1 May 18, 2023

(30) Foreign Application Priority Data

Nov. 17, 2021 (KR) ........................ 10-2021-0158354

(51) Int. Cl.
H01L 25/16 (2023.01)
H01L 23/00 (2006.01)

(52) U.S. Cl.
CPC ............ H01L 25/167 (2013.01); H01L 24/05 (2013.01); H01L 24/29 (2013.01); H01L 24/32 (2013.01); H01L 24/83 (2013.01); *H01L 24/24* (2013.01); *H01L 24/25* (2013.01); *H01L 2224/05571* (2013.01); *H01L 2224/05573* (2013.01); *H01L 2224/24051* (2013.01); *H01L 2224/24145* (2013.01); *H01L 2224/25175* (2013.01);
(Continued)

(58) Field of Classification Search
CPC ....... H01L 25/167; H01L 24/05; H01L 24/29; H01L 24/32; H01L 24/83; H01L 24/24;

H01L 24/25; H01L 2224/05571; H01L 2224/05573; H01L 2224/24051; H01L 2224/24145; H01L 2224/25175; H01L 2224/2919; H01L 2224/3224; H01L 2224/83007; H01L 2224/83874; H01L 25/0753; H10H 20/856; H10H 20/857; H10H 20/036; H10H 20/8506; H10H 20/851; H10D 86/40

See application file for complete search history.

(56) References Cited

U.S. PATENT DOCUMENTS

2006/0228559 A1 10/2006 Denker et al.
2018/0120611 A1 5/2018 Ko et al.
(Continued)

FOREIGN PATENT DOCUMENTS

JP 2019-152742 9/2019
KR 10-2007-0120574 12/2007
(Continued)

OTHER PUBLICATIONS

International Search Report,, corresponding to International Application No. PCT/KR2022/016008 dated Feb. 1, 2023.
(Continued)

*Primary Examiner* — Patricia D Valenzuela
(74) *Attorney, Agent, or Firm* — CANTOR COLBURN LLP

(57) ABSTRACT

A display device includes a printed circuit board attached to a side of a substrate, a frame facing the printed circuit board, a cover layer disposed between the substrate and the frame and overlapping the printed circuit board in a plan view, and a first reflective layer disposed on a surface of the frame and disposed between the frame and the cover layer.

20 Claims, 28 Drawing Sheets

(52) U.S. Cl.
CPC ................ *H01L 2224/2919* (2013.01); *H01L 2224/3224* (2013.01); *H01L 2224/83007* (2013.01); *H01L 2224/83874* (2013.01)

(56) References Cited

U.S. PATENT DOCUMENTS

| | | | | |
|---|---|---|---|---|
| 2018/0180930 A1* | 6/2018 | Cho | .................... | G02F 1/13452 |
| 2019/0109288 A1* | 4/2019 | Li | ........................ | H10K 85/346 |
| 2021/0004101 A1 | 1/2021 | Wei et al. | | |

FOREIGN PATENT DOCUMENTS

| | | |
|---|---|---|
| KR | 10-2017-0107139 | 9/2017 |
| KR | 10-2018-0046199 | 5/2018 |
| KR | 10-2018-0076693 | 7/2018 |
| KR | 10-2079095 | 2/2020 |
| KR | 1020200075403 A | 6/2020 |
| KR | 10-2020-0085835 | 7/2020 |

OTHER PUBLICATIONS

Written Opinion, corresponding to International Application No. PCT/KR2022/016008, dated Feb. 1, 2023.

* cited by examiner

T1: ACT, G1, SE, DE

PX

SPX1          SPX2          SPX3

21    22    CBA

CT1

Q3

Q1    Q3'

Q1'

CT2

30

OP

BNL1

Q2

Q2'

CNE1

CNE2

EMA

BNL2

DR2

⊗ → DR1

DR3

DF (a)

(b)

DISPLAY DEVICE AND METHOD OF MANUFACTURING THE SAME

CROSS-REFERENCE TO RELATED APPLICATION(S)

This application claims priority to and benefits of Korean Patent Application No. 10-2021-0158354 under 35 U.S.C. § 119, filed on Nov. 17, 2021, in the Korean Intellectual Property Office (KIPO), the entire contents of which are incorporated herein by reference in its entirety.

BACKGROUND

1. Technical Field

The disclosure relates to a display device and a method of manufacturing the same.

2. Description of the Related Art

The importance of display devices is increasing along with the development of multimedia. Accordingly, various types of display devices, such as organic light-emitting diode (OLED) displays and liquid crystal displays (LCDs), are being used.

Display devices are devices that display an image and include a display panel such as an organic light-emitting display panel or a liquid crystal display panel. Among these, the display device may include light-emitting elements as a light-emitting display panel. For example, a light-emitting diode (LED) may include an OLED that uses an organic material as a light-emitting material, an inorganic light-emitting diode that uses an inorganic material as a light-emitting material, or the like.

SUMMARY

Aspects of the disclosure provide a display device in which moisture proof properties can be improved by preventing the non-curing of a cover layer applied to a pad part, and a method of manufacturing the same.

It should be noted that objects of the disclosure are not limited to the above-described objects, and other objects of the disclosure will be apparent to those skilled in the art from the following descriptions.

According to an embodiment of the disclosure, a display device comprises a printed circuit board attached to a side of a substrate, a frame facing the printed circuit board, a cover layer disposed between the substrate and the frame and overlapping the printed circuit board in a plan view, and a first reflective layer disposed on a surface of the frame and disposed between the frame and the cover layer.

In an embodiment, the first reflective layer may include at least one selected from among an organic material, an inorganic material, and a metal.

In an embodiment, the first reflective layer may have a multi-layered structure in which a high refractive index layer and a low refractive index layer are alternately and repeatedly stacked.

In an embodiment, the first reflective layer may include a plurality of protrusion structures disposed on a surface of the first reflective layer contacting the cover layer.

In an embodiment, a cross-sectional shape of the plurality of protrusion structures may be a semicircular shape, a triangular shape, or a trapezoidal shape.

In an embodiment, the first reflective layer may have a thickness of about 20 nm to about 1,000 nm.

In an embodiment, the cover layer may include an ultraviolet (UV)-curable material.

In an embodiment, a space defined by the substrate, the frame, and the printed circuit board may be filled with the cover layer.

In an embodiment, a cross-sectional shape of the frame in a direction perpendicular to a length direction of the frame may be a bar shape.

In an embodiment, the frame includes an upper surface parallel to the substrate and a side surface bent in a direction intersecting the upper surface, and the first reflective layer may be disposed on the upper surface and the side surface of the frame.

In an embodiment, the display device may further comprise a protective layer disposed on a surface of the first reflective layer and disposed between the first reflective layer and the cover layer.

In an embodiment, the display device further comprises a second reflective layer disposed on a surface of the printed circuit board which faces the frame.

According to an embodiment of the disclosure, a display device comprises a display area and a pad part, a transistor layer, a light-emitting element layer, a wavelength conversion layer, and an anti-reflection member which are disposed in the display area on a substrate, a printed circuit board attached in the pad part to the substrate, a frame facing the printed circuit board, a cover layer disposed between the substrate and the frame and overlapping the printed circuit board in a plan view, and a first reflective layer disposed on a surface of the frame and disposed between the frame and the cover layer.

In an embodiment, the light-emitting element layer may be disposed on the transistor layer, the wavelength conversion layer may be disposed on the light-emitting element layer; the anti-reflection member may be disposed on the wavelength conversion layer, and the cover layer may contact at least one of the transistor layer, the light-emitting element layer, the wavelength conversion layer, and the anti-reflection member.

In an embodiment, the frame may contact a side surface of the anti-reflection member.

In an embodiment, the first reflective layer may contact at least one of the transistor layer, the light-emitting element layer, and the wavelength conversion layer.

In an embodiment, the first reflective layer may extend to the substrate and contact an upper surface of the substrate.

According to an embodiment of the disclosure, a method of manufacturing a display device, the method comprises forming a substrate to which a printed circuit board is attached and attaching ultraviolet (UV) tape to the substrate, forming a mold in which a release layer is formed on a surface of the mold, forming a frame in which a reflective layer is formed on a surface of the frame, disposing the frame on the release layer of the mold, attaching the mold to the substrate with the UV tape, applying a cover layer material between the substrate and the frame and irradiating UV light to form a cover layer, and detaching the mold from the substrate.

According to an embodiment of the disclosure, the cover layer may be formed by being cured with the UV light, and the frame and the substrate are connected by the cover layer.

According to an embodiment of the disclosure, the detaching of the mold may include irradiating the UV light onto the UV tape and then detaching the mold from the substrate.

BRIEF DESCRIPTION OF THE DRAWINGS

The above and other aspects and features of the disclosure will become more apparent by describing embodiments thereof in detail with reference to the attached drawings, in which.

DETAILED DESCRIPTION OF THE EMBODIMENTS

Figure 1:
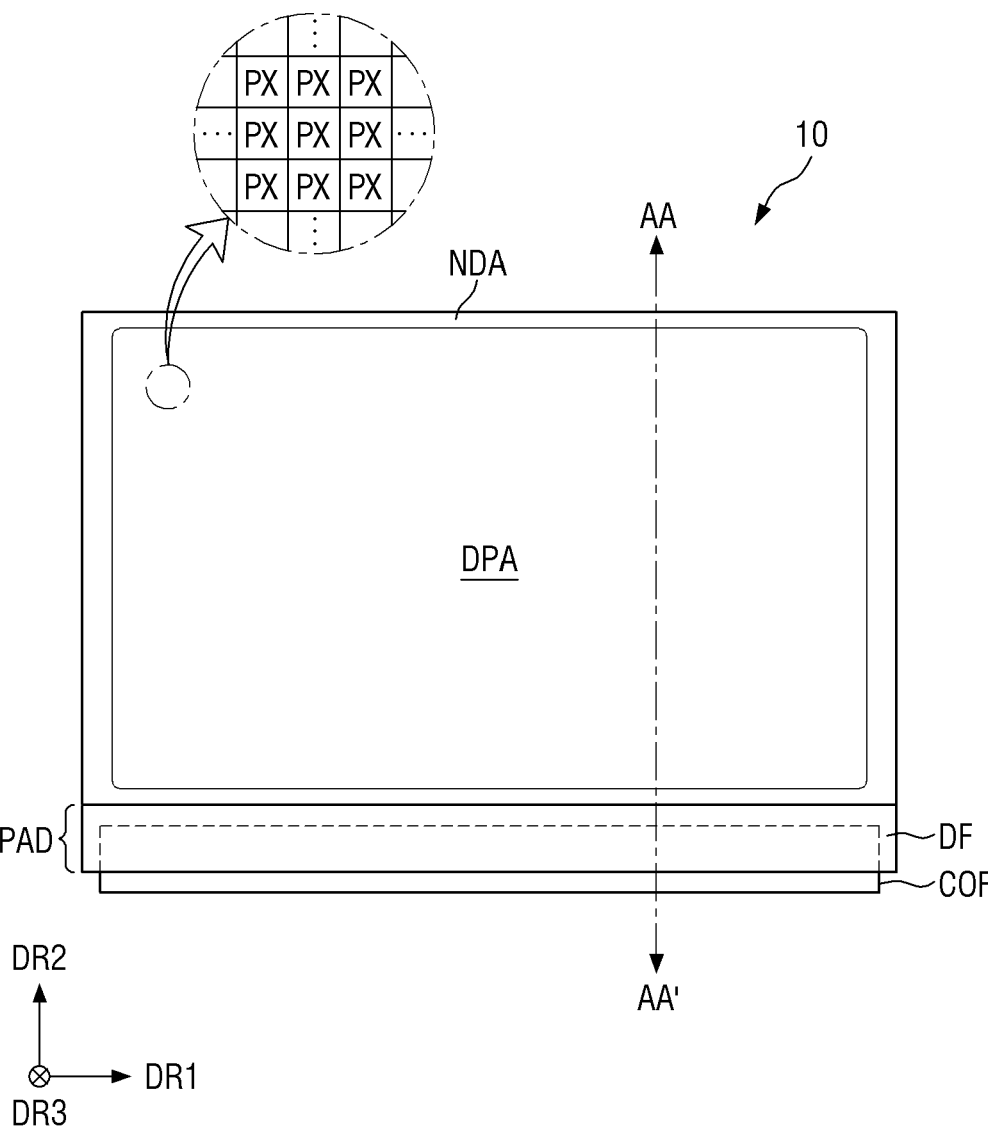
FIG. 1 is a schematic plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification. It will be understood that the terms "contact," "connected to," and "coupled to" may include a physical and/or electrical contact, connection, or coupling.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, specific embodiments will be described with reference to the accompanying drawings.

FIG. 1 is a schematic plan view of a display device according to one embodiment.

Referring to FIG. 1, a display device 10 displays a video or a still image. The display device 10 may refer to any electronic device that provides a display screen. For example, the display device 10 may include a television, a laptop computer, a monitor, a billboard, a device for the Internet of Things, a mobile phone, a smartphone, a tablet personal computer (PC), an electronic watch, a smartwatch, a watch phone, a head-mounted display, a mobile communication terminal, an electronic notebook, an e-book reader, a portable multimedia player (PMP), a navigation system, a game console, a digital camera, and a camcorder, which are provided with a display screen.

The display device 10 includes a display panel that provides a display screen. Examples of the display panel may include an inorganic light-emitting diode display panel, an organic light-emitting display panel, a quantum dot light-emitting display panel, a plasma display panel, a field emission display panel, and the like. Hereinafter, although an example is described in which the inorganic light-emitting diode display panel is applied as the example of the display panel, the disclosure is not limited thereto, and a device to which the same technical spirit is applicable may be applied to other display panels.

A first direction DR1, a second direction DR2, and a third direction DR3 are defined in drawings for describing the display device 10. The first direction DR1 and the second direction DR2 may be directions perpendicular to each other in a plane. The third direction DR3 may be a direction perpendicular to a plane in which the first direction DR1 and the second direction DR2 are positioned. The third direction DR3 is perpendicular to each of the first direction DR1 and the second direction DR2. In the embodiments for describing the display device 10, the third direction DR3 indicates a thickness direction of the display device 10.

A shape of the display device 10 may be variously modified. For example, the display device 10 may have a rectangular shape in which a side thereof in the first direction DR1 is longer than a side thereof in the second direction DR2 in a plan view. As another example, the display device 10 may have a rectangular shape in which a side thereof in the second direction DR2 is longer than a side thereof in the first direction DR1 in a plan view. However, the disclosure is not limited thereto, and the display device 10 may have shapes such as a square shape, a quadrangular shape with round corners (vertexes), other polygonal shapes, and a circular shape in a plan view. A shape of a display area DPA of the display device 10 may also be similar to an overall shape of the display device 10. FIG. 1 illustrates the display device 10 and the display area DPA having a rectangular shape in which a side thereof in the first direction DR1 is longer than a side thereof in the second direction DR2.

The display device 10 may include the display area DPA and a non-display area NDA. The display area DPA is an area in which an image may be displayed, and the non-display area NDA is an area in which an image is not displayed. The display area DA may be referred to as an active area, and the non-display area NDA may be referred to as an inactive area. The display area DPA may substantially occupy a center of the display device 10.

The display area DPA may include pixels PX. The pixels PX may be arranged in a matrix form. A shape of each pixel PX may be a rectangular shape or a square shape in a plan view but is not limited thereto, and the shape may be a rhombic shape of which each side is inclined with respect to a direction. The pixels PX may be alternately arranged as a stripe type or a PENTILE™ type. In addition, each of the pixels PX may include one or more light-emitting elements that emit light at a specific wavelength, thereby displaying a specific color.

The non-display area NDA may be disposed around the display area DPA. The non-display area NDA may completely or partially surround the display area DPA. The display area DPA has a rectangular shape, and the non-display area NDA may be disposed adjacent to four sides of the display area DPA. The non-display area NDA may form a bezel of the display device 10. In each non-display area NDA, lines or circuit drivers included in the display device 10 may be disposed, or external devices may be mounted.

A pad part PAD to which a printed circuit board COF is coupled (or connected) may be disposed in the non-display area NDA. The pad part PAD may include pad electrodes through which external signals are applied to the display area DPA. In addition, a frame DF for covering (or overlapping, e.g., in a plan view) the pad part PAD may be disposed on the pad part PAD of the non-display area NDA. The frame DF may be made of a material capable of absorbing or blocking light, thereby preventing the pad part PAD and the printed circuit board COF from being viewed from the outside.

Figure 2:
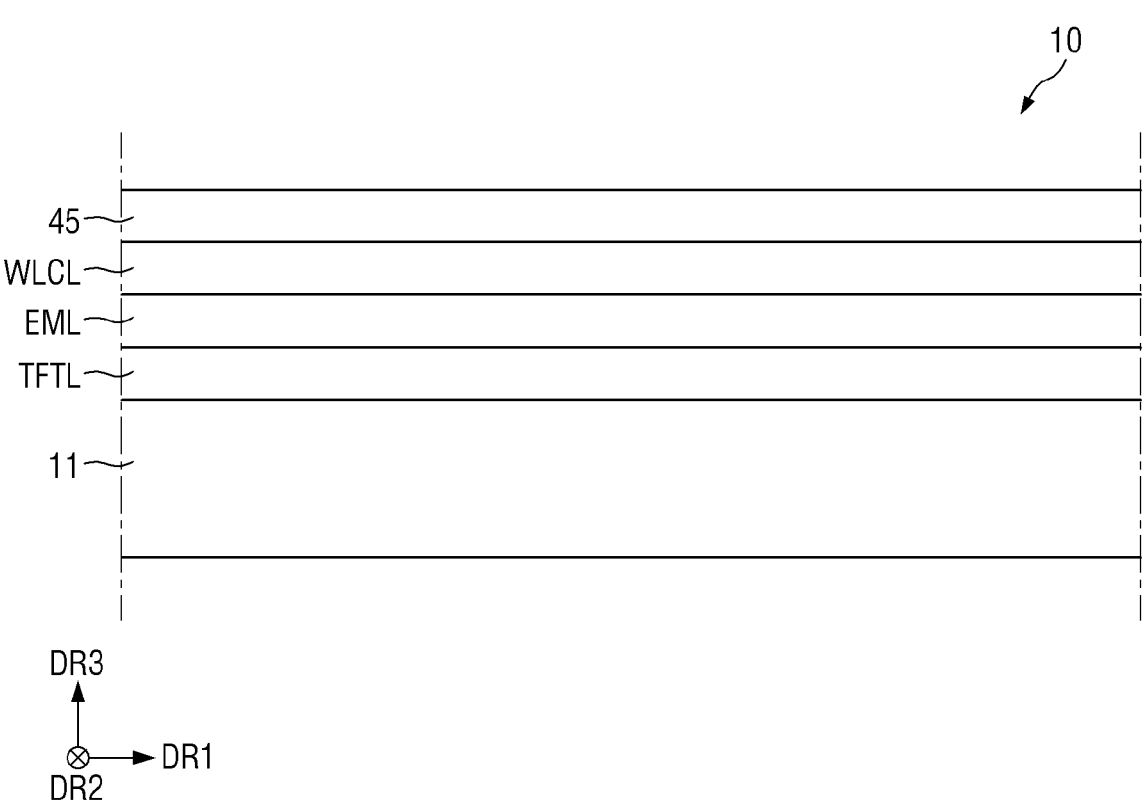
FIG. 2 is a schematic cross-sectional view illustrating a display device according to an embodiment.

FIG. 2 is a schematic cross-sectional view illustrating a display device according to an embodiment.

Referring to FIG. 2, a display device 10 may include a substrate 11, a transistor layer TFTL, a light-emitting element layer EML, a wavelength conversion layer WLCL, and an anti-reflection member 45.

The substrate 11 may be a base substrate or a base member and may be made of an insulating material such as glass or a polymer resin. For example, the substrate 11 may be a rigid substrate. As another example, the substrate 11 may be a flexible substrate which is bendable, foldable, and rollable. In this case, the substrate 11 may include polyimide (PI), but the disclosure is not limited thereto.

The transistor layer TFTL may be disposed on the substrate 11. The transistor layer TFTL may include a pixel circuit capable of driving each pixel of the display device 10. The pixel circuit may include one or more thin film transistors, one or more capacitors, and signal lines.

The light-emitting element layer EML may be disposed on the transistor layer TFTL. The light-emitting element layer EML may include light-emitting elements which emit light. The light-emitting element may be an organic light-emitting element or an inorganic light-emitting element. Hereinafter, an example of the light-emitting element layer EML including the inorganic light-emitting element will be described in the embodiment. However, the disclosure is not limited thereto, and the light-emitting element layer EML may include the organic light-emitting element.

The wavelength conversion layer WLCL may be disposed on the light-emitting element layer EML. The wavelength conversion layer WLCL may convert wavelengths of light, emitted from the light-emitting element layer EML, into different wavelengths.

The anti-reflection member 45 may be disposed on the wavelength conversion layer WLCL. The anti-reflection member 45 may prevent a decrease in visibility due to external light reflected from an upper surface of the display device 10.

Hereinafter, a transistor layer TFTL, a light-emitting element layer EML, a wavelength conversion layer WLCL, and an anti-reflection member 45 will be described with reference to FIGS. 3 to 6.

Figure 3:
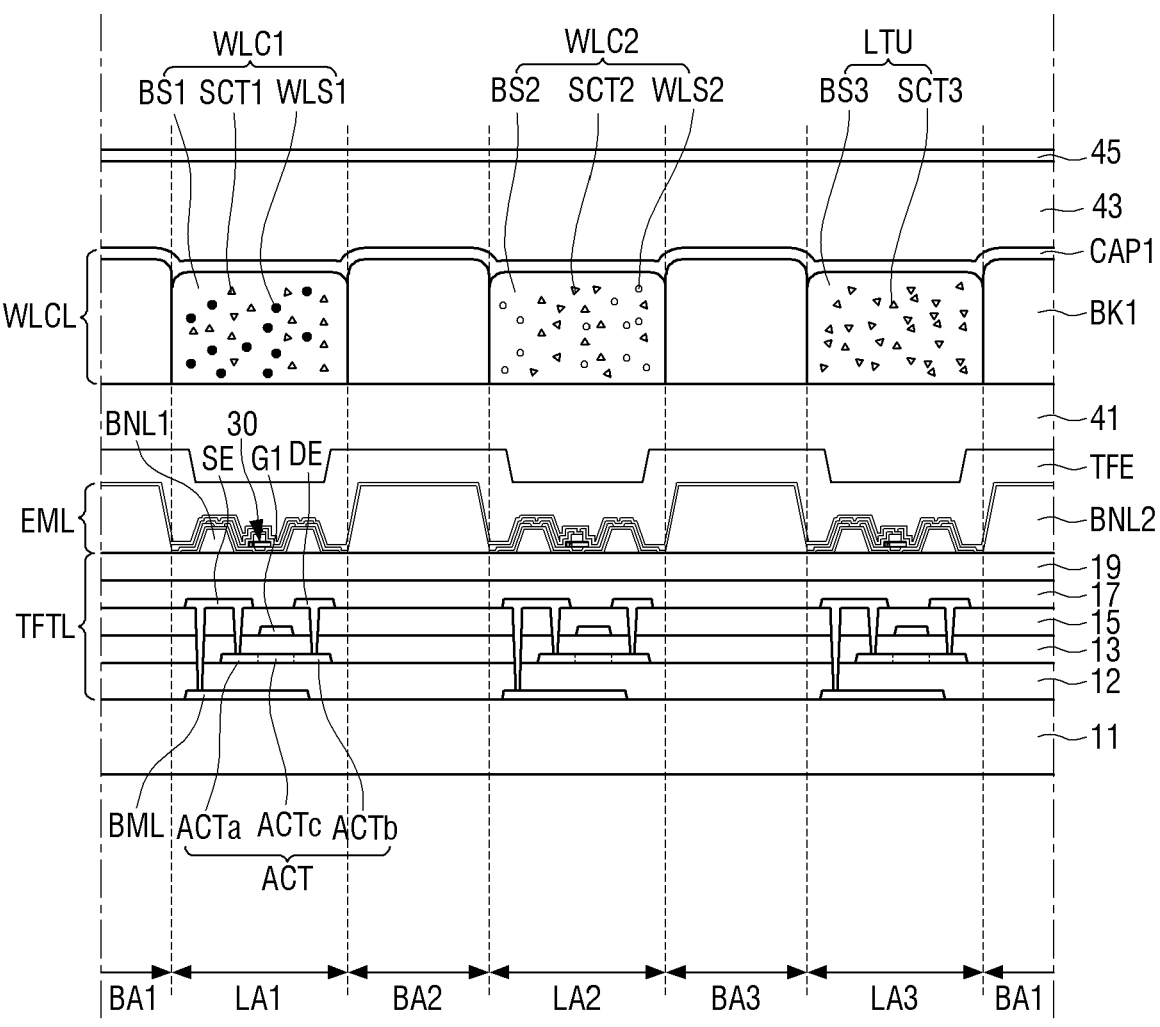
FIG. 3 is a schematic cross-sectional view illustrating a pixel of a display device according to an embodiment.
Figure 3:
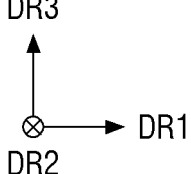

FIG. 3 is a schematic cross-sectional view illustrating one pixel of a display device according to an embodiment.

Referring to FIG. 3, a display area DPA (see FIG. 1) of a display device 10 may include first to third emission areas LA1, LA2, and LA3. Each of the first to third emission areas LA1, LA2, and LA3 may be an area in which light generated by light-emitting elements 30 of the display device 10 is emitted to the outside of the display device 10. In addition, the display area of the display device 10 may include first to third light blocking areas BA1, BA2, and BA3 which partition and surround the first to third emission areas LA1, LA2, and LA3.

The display device 10 may include a substrate 11, a buffer layer 12, a transistor layer TFTL, a light-emitting element layer EML, a wavelength conversion layer WLCL, and an anti-reflection member 45.

The buffer layer 12 may be disposed on the substrate 11. The buffer layer 12 may be formed as an inorganic film capable of preventing the permeation of air or moisture. For example, the buffer layer 12 may include inorganic films which are alternately stacked.

The transistor layer TFTL may be disposed on the buffer layer 12. The transistor layer TFTL may include a first transistor T1, a first gate insulating layer 13, a first interlayer insulating layer 15, a second interlayer insulating layer 17, and a first planarization layer 19.

The first transistor T1 may be disposed on the buffer layer 12 and may form (or constitute) a pixel circuit of each of pixels. For example, the first transistor T1 may be a driving transistor or a switching transistor of the pixel circuit. The first transistor T1 may include an active layer ACT, a gate electrode G1, a source electrode SE, and a drain electrode DE. The active layer ACT may include conductive regions ACTa and ACTb and a channel region ACTc therebetween.

The light-emitting element layer EML may be disposed on the transistor layer TFTL. The light-emitting element layer EML may include a first pattern BNL1, the light-emitting element 30, and a second pattern BNL2. The light-emitting element 30 may be disposed on the first transistor T1. The light-emitting element 30 may be disposed between a first electrode and a second electrode and may be connected to each of a first connection electrode and a second connection electrode.

The transistor layer TFTL and the light-emitting element layer EML will be described in detail below with reference to FIGS. 4 to 6.

An encapsulation layer TFE may be disposed on the light-emitting element layer EML. The encapsulation layer TFE may cover an upper surface and a side surface of the light-emitting element layer EML. For example, the encapsulation layer TFE may include at least one inorganic layer to prevent the permeation of oxygen or moisture. In addition, the encapsulation layer TFE may include at least one organic film to protect the light-emitting element layer EML from foreign materials such as dust. For example, the encapsulation layer TFE may have a structure in which at least one organic film is stacked between two inorganic films. Each of the inorganic films may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, lithium fluoride, or the like. The organic layer may include at least one selected from among an acrylic-based resin, a methacrylic-based resin, polyisoprene, a vinyl-based resin, an epoxy-based resin, a urethane-based resin, a cellulose-based resin, and a perylene-based resin. However, the structure of the encapsulation layer TFE is not limited to the above-described example, and the stacked structure thereof may be variously modified.

A second planarization layer 41 may be disposed on the encapsulation layer TFE to planarize an upper portion of the encapsulation layer TFE. The second planarization layer 41 may include an organic material. For example, the second planarization layer 41 may include at least one selected from among an acryl resin, an epoxy resin, a phenolic resin, a polyamide resin, and a PI resin.

The wavelength conversion layer WLCL may be disposed on the second planarization layer 41. The wavelength conversion layer WLCL may include a first light blocking member BK1, a first wavelength conversion part WLC1, a second wavelength conversion part WLC2, a light transmitting part LTU, and a first capping layer CAP1.

The first light blocking member BK1 may be disposed on the second planarization layer 41 so as to overlap the first to third light blocking areas BA1, BA2, and BA3. The first light blocking member BK1 may overlap the second pattern BNL2 in a thickness direction thereof. The first light blocking member BK1 may block light transmission. The first light blocking member BK1 may prevent color mixing due to the infiltration of light between the first to third emission areas LA1, LA2, and LA3, thereby improving color reproducibility. The first light blocking member BK1 may be disposed in a grid form that surrounds the first to third emission areas LA1, LA2, and LA3 in a plan view. The first light blocking member BK1 may be disposed to not overlap the first to third emission areas LA1, LA2, and LA3.

The first light blocking member BK1 may include an organic light blocking material and a liquid-repellent component. Here, the liquid-repellent component may include a fluorine-containing monomer or a fluorine-containing polymer and specifically may include fluorine-containing aliphatic polycarbonate. For example, the first light blocking member BK1 may be made of a black organic material including a liquid-repellent component. The first light blocking member BK1 may be formed by coating and exposing processes of an organic light blocking material including a liquid-repellent component.

Since the first light blocking member BK1 includes the liquid-repellent component, the first wavelength conversion part WLC1, the second wavelength conversion part WLC2, and the light transmitting part LTU may be separated to correspond to the emission areas LA1 to LA3. For example, in case that the first and second wavelength conversion parts WLC1 and WLC2 and the light transmitting part LTU are formed by an inkjet method, ink compositions may flow on an upper surface of the first light blocking member BK1. In this case, since the first light blocking member BK1 includes the liquid-repellent component, the ink compositions can be guided to flow into the emission areas. Accordingly, the first light blocking member BK1 may prevent the ink compositions from being mixed.

The first wavelength conversion part WLC1 may be disposed in the first emission area LA1 on the second planarization layer 41. The first wavelength conversion part WLC1 may be surrounded by the first light blocking member BK1. The first wavelength conversion part WLC1 may include a first base resin BS1, a first scatterer SCT1, and a first wavelength shifter WLS1.

The first base resin BS1 may include a material having relatively high light transmittance. The first base resin BS1 may include a transparent organic material. For example, the first base resin BS1 may include at least one selected from among organic materials such as an epoxy-based resin, an acrylic-based resin, a cardo-based resin, and an imide-based resin.

The first scatterer SCT1 and the first base resin BS1 may have different refractive indices, and the first scatterer SCT1 may form an optical interface with the first base resin BS1. For example, the first scatterer SCT1 may include a light scattering material or light scattering particles that scatter at least a portion of light passing therethrough. For example, the first scatterer SCT1 may include metal oxide particles of titanium oxide ($TiO_2$), zirconium oxide ($ZrO_2$), aluminum oxide ($Al_xO_y$), indium oxide ($In_2O_3$), zinc oxide (ZnO), tin oxide ($SnO_2$), or the like or organic particles of an acrylic-based resin, a urethane-based resin, or the like. The first scatterer SCT1 may scatter incident light in a random direction irrespective of an incident direction of the incident light without substantially converting a peak wavelength of the incident light.

The first wavelength shifter WLS1 may convert or shift a peak wavelength of incident light into a first peak wavelength. For example, the first wavelength shifter WLS1 may convert blue light, provided from the light-emitting element layer EML, into red light having a single peak wavelength in a range of about 610 nm to about 650 nm to emit the red light. The first wavelength shifter WLS1 may include quantum dots, quantum rods, or fluorescent materials. The quantum dots may be a particulate matter in which electrons transition from a conduction band to a valance band to emit light with a specific color.

For example, the quantum dots may be a semiconductor nanocrystal material. The quantum dots may have a specific band gap according to the composition and size thereof so as to absorb light and may emit light having an intrinsic wavelength. Examples of semiconductor nanocrystals of the quantum dots may include IV group-based nanocrystals, II-VI group-based compound nanocrystals, III-V group-based compound nanocrystals, IV-VI group-based nanocrystals, or combinations thereof.

For example, the quantum dots may have a core-shell structure which includes a core including the above-described nanocrystals and a shell surrounding the core. The shell of the quantum dots may serve as a protective layer which prevents chemical modification of the core and maintains semiconductor properties and may serve as a charging layer which imparts electrophoretic properties to the quantum dots. The shell may be a single layer or a multi-layer. An interface between the core and the shell may have a concentration gradient such that a concentration of an element in the shell gradually decreases toward a center thereof. The shell of the quantum dots may include a metal or nonmetal oxide, a semiconductor compound, or a combination thereof.

Light emitted by the first wavelength shifter WLS1 may have a full width at half maximum (FWHM) of an emission wavelength spectrum of about 45 nm or less, about 40 nm or less, or about 30 nm or less, and thus, the purity of colors displayed by the display device 10 and the color reproducibility of the display device 10 may be further improved. Light emitted by the first wavelength shifter WLS1 may be emitted in various directions irrespective of an incident direction of incident light. Accordingly, the side visibility of a red color displayed in the first emission area LA1 may be improved.

A portion of blue light provided from the light-emitting element layer EML may pass through the first wavelength conversion part WLC1 without being converted into red light by the first wavelength shifter WLS1. In an embodiment, color filters (not shown) may be disposed on the wavelength conversion layer WLCL. For example, a first color filter and a second color filter may be disposed on the first wavelength conversion part WLC1 and the second wavelength conversion part WLC2, respectively. Among the blue light provided from the light-emitting element layer EML, light incident on the first color filter without being converted by the first wavelength conversion part WLC1 may be blocked by the first color filter. Among the blue light provided from the light-emitting element layer EML, red light converted by the first wavelength conversion part WLC1 may pass through the first color filter to be emitted to the outside. Accordingly, the first emission area LA1 may emit the red light.

The second wavelength conversion part WLC2 may be disposed in the second emission area LA2 on the second planarization layer 41. The second wavelength conversion part WLC2 may be surrounded by the first light blocking member BK1. The second wavelength conversion part WLC2 may include a second base resin BS2, a second scatterer SCT2, and a second wavelength shifter WLS2.

The second base resin BS2 may include a material having relatively high light transmittance. The second base resin BS2 may include a transparent organic material. For example, the second base resin BS2 and the first base resin BS1 may include a same material, or the second base resin BS2 may include the described material of the first base resin BS1.

The second scatterer SCT2 and the second base resin BS2 may have different refractive indices, and the second scatterer SCT2 may form an optical interface with the second base resin BS2. For example, the second scatterer SCT2 may include a light scattering material or light scattering particles that scatter at least a portion of light passing therethrough. For example, the second scatterer SCT2 and the first scatterer SCT1 may be made of a same material, or the second scatterer SCT2 may be made of the described material of the first scatterer SCT1. The second scatterer SCT2 may scatter incident light in a random direction irrespective of an incident direction of the incident light without substantially converting a peak wavelength of the incident light.

The second wavelength shifter WLS2 may convert or shift a peak wavelength of incident light into a second peak wavelength different from the first peak wavelength of the first wavelength shifter WLS1. For example, the second wavelength shifter WLS2 may convert blue light provided from the light-emitting element layer EML into green light having a single peak wavelength in a range of about 510 nm to about 550 nm to emit the green light. The second wavelength shifter WLS2 may include quantum dots, quantum rods, or fluorescent materials. The second wavelength shifter WLS2 may include a material having the same effect as the described material of the first wavelength shifter WLS1. The second wavelength shifter WLS2 may include quantum dots, quantum rods, or fluorescent materials so that a wavelength conversion range thereof is different from a wavelength conversion range of the first wavelength shifter WLS1.

The light transmitting part LTU may be disposed in the third emission area LA3 on the second planarization layer

41. The light transmitting part LTU may be surrounded by the first light blocking member BK1. The light transmitting part LTU may transmit incident light by maintaining a peak wavelength thereof. The light transmitting part LTU may include a third base resin BS3 and a third scatterer SCT3.

The third base resin BS3 may include a material having relatively high light transmittance. The third base resin BS3 may include a transparent organic material. For example, the third base resin BS3 and the first or second base resin BS1 or BS2 may include a same material, or the third base resin BS3 may include the described material of the first or second base resin BS1 or BS2.

The third scatterer SCT3 and the third base resin BS3 may have different refractive indices, and the third scatterer SCT3 may form an optical interface with the third base resin BS3. For example, the third scatterer SCT3 may include a light scattering material or light scattering particles that scatter at least a portion of light passing therethrough. For example, the third scatterer SCT3 and the first or second scatterer SCT1 or SCT2 may be made of a same material, or the third scatterer SCT3 may be made of the described material of the first or second scatterer SCT1 or SCT2. The third scatterer SCT3 may scatter incident light in a random direction irrespective of an incident direction of the incident light without substantially converting a peak wavelength of the incident light.

Since the wavelength conversion layer WLCL is disposed directly on the second planarization layer 41, the display device 10 may not need a separate substrate for the first and second wavelength conversion parts WLC1 and WLC2 and the light transmitting part LTU. Accordingly, the first wavelength conversion part WLC1, the second wavelength conversion part WLC2, and the light transmitting part LTU can be readily aligned in the first to third emission areas LA1, LA2, and LA3, respectively, and the thickness of the display device 10 can be relatively reduced.

The first capping layer CAP1 may cover (or overlap) the first and second wavelength conversion parts WLC1 and WLC2, the light transmitting part LTU, and the first light blocking member BK1. For example, the first capping layer CAP1 may seal the first and second wavelength conversion parts WLC1 and WLC2 and the light transmitting part LTU, thereby preventing damage to or contamination of the first and second wavelength conversion parts WLC1 and WLC2 and the light transmitting part LTU. The first capping layer CAP1 may include an inorganic material. For example, the first capping layer CAP1 may include at least one selected from among silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

A third planarization layer 43 may be included on the first capping layer CAP1. The third planarization layer 43 may planarize an upper portion of the first capping layer CAP1. The third planarization layer 43 and the second planarization layer 41 may be made of a same material, or the third planarization layer 43 may be made of the described material of the second planarization layer 41.

The anti-reflection member 45 may be disposed on the third planarization layer 43. The anti-reflection member 45 may absorb light incident from the outside to prevent degradation in display quality due to reflection of external light. In an embodiment, the anti-reflection member 45 includes a dye capable of absorbing light other than light having first to third colors (for example, a red color, a green color, and a blue color), thereby preventing reflection of external light.

Hereinafter, a transistor layer TFTL and a light-emitting element layer EML will be described in detail through the planar and cross-sectional structures of a pixel of a display device 10 according to an embodiment.

Figure 4:
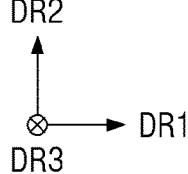
FIG. 4 is a plan view illustrating a pixel of a display device according to an embodiment.

FIG. 4 is a schematic plan view illustrating a pixel of a display device according to an embodiment.

Referring to FIG. 4, each of pixels PX may include subpixels SPXn (where n is an integer from one to three). For example, a pixel PX may include a first subpixel SPX1, a second subpixel SPX2, and a third subpixel SPX3. The first subpixel SPX1, the second subpixel SPX2, and the third subpixel SPX3 may emit light having a third color. For example, the first subpixel SPX1, the second subpixel SPX2, and the third subpixel SPX3 may each emit light having a blue color. However, the disclosure is not limited thereto, and the first subpixel SPX1 may emit light having a first color, the second subpixel SPX2 may emit light having a second color, and the third subpixel SPX3 may emit light having the third color. As an example, the first color may be a blue color, the second color may be a green color, and the third color may be a red color. In addition, although FIG. 4 illustrates that the pixel PX includes three subpixels SPXn, the disclosure is not limited thereto, and the pixel PX may include more subpixels SPXn.

Each of the subpixels SPXn of a display device 10 may include an emission part EMA and a non-emission part (not shown). The emission part EMA may be an area in which light-emitting elements 30 are disposed so that light having a specific wavelength is emitted, and the non-emission part may be an area in which the light-emitting elements 30 are not disposed and which light emitted from the light-emitting elements 30 does not arrive so that light is not emitted. The emission part EMA may include an area in which the light-emitting element 30 is disposed and may also include an area adjacent to the light-emitting element 30, for example, an area in which light emitted from the light-emitting element 30 is emitted.

However, the disclosure is not limited thereto, and the emission part EMA may also include an area in which light emitted from the light-emitting element 30 is reflected or refracted by other members and emitted. The light-emitting elements 30 may be disposed in each subpixel SPXn, and the area in which the light-emitting elements 30 are disposed and the area adjacent to the light-emitting elements 30 may be combined to form the emission part. The emission part EMA may correspond to the emission areas LA1, LA2, and LA3 described above, and the non-emission part may correspond to the light blocking areas BA1, BA2, and BA3 described above.

In addition, each subpixel SPXn may include a cutout part CBA disposed in the non-emission part. The cutout part CBA may be disposed at a side of the emission part EMA in a second direction DR2. The cutout part CBA may be disposed between the emission parts EMA of the adjacent subpixels SPXn in the second direction DR2. Emission parts EMA and cutout parts CBA may be arranged in a display area DPA of the display device 10. For example, the emission parts EMA and the cutout parts CBA may each be repeatedly arranged in a first direction DR1, and the emission part EMA and the cutout part CBA may be alternately arranged in the second direction DR2. In addition, a spacing interval between the cutout parts CBA in the first direction DR1 may be smaller than a spacing interval between the emission parts EMA in the first direction DR1. A second pattern BNL2 may be disposed between the cutout parts CBA and between the emission parts EMA, and an interval therebetween may vary according to a width of the second pattern BNL2. Since the light-emitting element 30 is not disposed in the cutout part CBA, light is not emitted through the cutout parts CBA, but portions of electrodes 21 and 22 disposed in each subpixel SPXn may be disposed in the cutout part CBA. The electrodes 21 and 22 disposed in each subpixel SPXn may be disposed to be separated from each other in the cutout part CBA.

Figure 5:
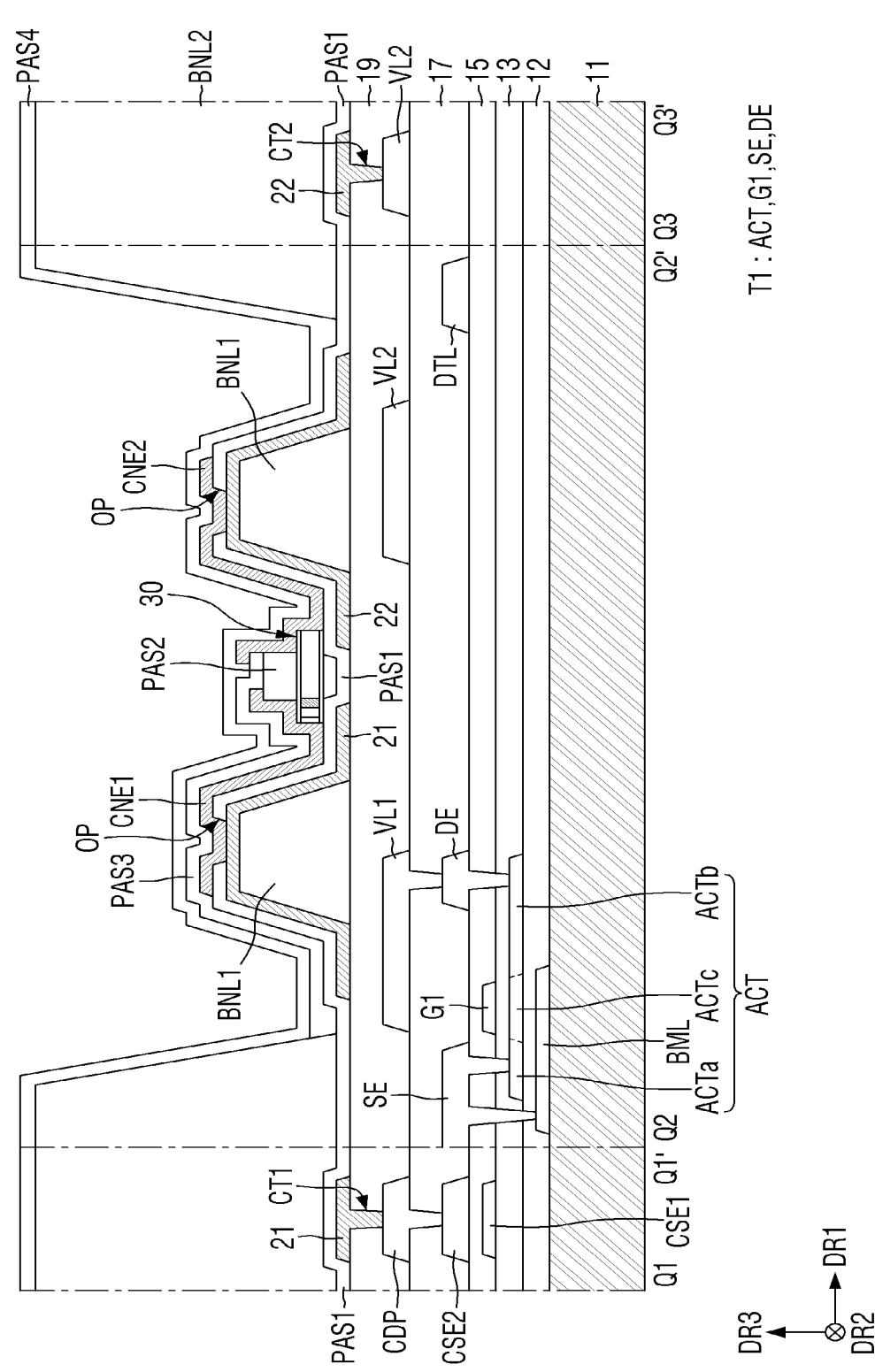
FIG. 5 is a schematic cross-sectional view taken along lines Q1-Q1', Q2-Q2', and Q3-Q3' of FIG. 4.

FIG. 5 is a schematic cross-sectional view taken along lines Q1-Q1', Q2-Q2', and Q3-Q3' of FIG. 4.

Referring to FIGS. 4 and 5, the display device 10 may include a substrate 11, and a semiconductor layer, conductive layers, and insulating layers which are disposed on the substrate 11. The semiconductor layer, the conductive layers, and the insulating layers may form a circuit layer and a light-emitting element layer of the display device 10.

A light blocking layer BML may be disposed on the substrate 11. The light blocking layer BML may be disposed to overlap an active layer ACT of a first transistor T1 of the display device 10. The light blocking layer BML may include a material that blocks light, thereby preventing light from being incident on the active layer ACT1 of the first transistor T1. For example, the light blocking layer BML may be made of an opaque metal material that blocks light transmission. However, the disclosure is not limited thereto, and in some embodiments, the light blocking layer BML may be omitted. In addition, the light blocking layer BML may be electrically connected to a source electrode SE to serve to suppress a change in voltage of the transistor. Furthermore, the light blocking layer BML may be used as lines such as power lines, data lines, or gate lines.

A buffer layer 12 may be disposed on the entirety of the substrate 11 on which the light blocking layer BML is disposed. The buffer layer 12 may be formed on the substrate 11 to protect the first transistors T1 of the pixel PX from moisture permeating through the substrate 11 that is vulnerable to moisture permeation. The buffer layer 12 may perform a surface planarization function. The buffer layer 12 may be provided as inorganic layers that are alternately stacked. For example, the buffer layer 12 may be formed as a multi-layer in which inorganic layers, which include at least one selected from among silicon oxide (SiO$_x$), silicon nitride (SiN$_x$), and silicon oxynitride (SiO$_x$N$_y$), are alternately stacked.

The semiconductor layer may be disposed on the buffer layer 12. The semiconductor layer may include the active layer ACT of the first transistor T1. The semiconductor layer and the active layer ACT may be disposed to partially overlap a gate electrode G1 or the like of a first gate conductive layer to be described below.

FIG. 5 illustrates only the first transistor T1 among transistors included in the subpixel SPXn of the display device 10, but the disclosure is not limited thereto. The display device 10 may include more transistors. For example, in addition to the first transistor T1, the display device 10 may further include one or more transistors to include two or three transistors for each subpixel SPXn.

The semiconductor layer may include polycrystalline silicon, single crystal silicon, an oxide semiconductor, or the like. In case that the semiconductor layer includes an oxide semiconductor, each active layer ACT may include conductive regions ACTa and ACTb and a channel region ACTc therebetween. The oxide semiconductor may be an oxide semiconductor including indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium gallium zinc tin oxide (IGZTO), or the like.

In an embodiment, the semiconductor layer may include polycrystalline silicon. Polycrystalline silicon may be formed by crystallizing amorphous silicon. In this case, the conductive regions of the active layer ACT may be doped regions that are doped with impurities.

A first gate insulating layer 13 may be disposed on the semiconductor layer and the buffer layer 12. The first gate insulating layer 13 may be disposed on the buffer layer 12 and the semiconductor layer. The first gate insulating layer 13 may serve as a gate insulating film of each of the transistors. The first gate insulating layer 13 may be formed as an inorganic layer including an inorganic material, for example, at least one selected from among silicon oxide (SiO$_x$), silicon nitride (SiN$_x$), and silicon oxynitride (Si-O$_x$N$_y$) or may be formed in a structure in which the inorganic layers are stacked.

The first gate conductive layer may be disposed on the first gate insulating layer 13. The first gate conductive layer may include the gate electrode G1 of the first transistor T1 and a first capacitance electrode CSE1 of a storage capacitor. The gate electrode G1 may be disposed to overlap the channel region ACTc of the active layer ACT in a thickness direction thereof. The first capacitance electrode CSE1 may be disposed to overlap a second capacitance electrode CSE2 to be described below in a thickness direction thereof. In an embodiment, the first capacitance electrode CSE1 may be connected to and integrated with the gate electrode G1. The first capacitance electrode CSE1 may be disposed to overlap the second capacitance electrode CSE2 in the thickness direction, and the storage capacitor may be formed therebetween.

The first gate conductive layer may be formed as a single layer or a multi-layer made of at least one selected from among molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A first interlayer insulating layer 15 may be disposed on the first gate conductive layer. The first interlayer insulating layer 15 may serve as an insulating film between the first gate conductive layer and other layers disposed thereon. In addition, the first interlayer insulating layer 15 may be disposed to cover the first gate conductive layer and may perform a function of protecting the first gate conductive layer. The first interlayer insulating layer 15 may be formed as an inorganic layer including an inorganic material, for example, at least one selected from among silicon oxide (SiO$_x$), silicon nitride (SiN$_x$), and silicon oxynitride (Si-O$_x$N$_y$) or may be formed in a structure in which the inorganic layers are stacked.

A first data conductive layer may be disposed on the first interlayer insulating layer 15. The first data conductive layer may include a source electrode SE and a drain electrode DE of the first transistor T1, a data line DTL, and the second capacitance electrode CSE2.

The source electrode SE and the drain electrode DE of the first transistor T1 may contact the doped regions ACTa and ACTb of the active layer ACT, respectively, through contact holes passing through the first interlayer insulating layer 15 and the first gate insulating layer 13. In addition, the source electrode SE of the first transistor T1 may contact the light blocking layer BML through another contact hole.

The data line DTL may apply a data signal to other transistors (not shown) included in the display device 10.

Although not shown in the drawing, the data line DTL may be connected to source/drain electrodes of other transistors to transmit signals applied to the data line DTL.

The second capacitance electrode CSE2 may be disposed to overlap the first capacitance electrode CSE1 in a thickness direction thereof. In an embodiment, the second capacitance electrode CSE2 may be connected to and integrated with the source electrode SE.

The first data conductive layer may be formed as a single layer or a multi-layer that is made of at least one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A second interlayer insulating layer 17 may be disposed on the first data conductive layer. The second interlayer insulating layer 17 may serve as an insulating film between the first data conductive layer and other layers disposed thereon. In addition, the second interlayer insulating layer 17 may cover (or overlap, e.g., in a plan view) the first data conductive layer and may perform a function of protecting the first data conductive layer. The second interlayer insulating layer 17 may be formed as an inorganic layer including an inorganic material, for example, at least one selected from among silicon oxide ($SiO_x$), silicon nitride ($SiN_x$), and silicon oxynitride ($SiO_xN_y$) or may be formed in a structure in which the inorganic layers are stacked.

A second data conductive layer may be disposed on the second interlayer insulating layer 17. The second data conductive layer may include a first voltage line VL1, a second voltage line VL2, and a first conductive pattern CDP. A high-potential voltage (or a first power voltage) to be supplied to the first transistor T1 may be applied to the first voltage line VL1, and a low-potential voltage (or a second power voltage) to be supplied to a second electrode 22 may be applied to the second voltage line VL2. In addition, an arrangement signal required to arrange the light-emitting elements 30 may be applied to the second voltage line VL2 in a manufacturing process of the display device 10.

The first conductive pattern CDP may be connected to the second capacitance electrode CSE2 through a contact hole formed in the second interlayer insulating layer 17. The second capacitance electrode CSE2 may be integrated with the source electrode SE of the first transistor T1, and the first conductive pattern CDP may be electrically connected to the source electrode SE. The first conductive pattern CDP may also contact a first electrode 21 to be described below, and the first transistor T1 may transmit the first power voltage, applied from the first voltage line VL1, to the first electrode 21 through the first conductive pattern CDP. FIG. 5 illustrates that the second data conductive layer includes a second voltage line VL2 and a first voltage line VL1, but the disclosure is not limited thereto. The second data conductive layer may include more first voltage lines VL1 and more second voltage lines VL2. However, the disclosure is not limited thereto, and the first data conductive layer may serve to transmit a signal such as a power voltage or the like. In this case, the second data conductive layer may be omitted.

The second data conductive layer may be formed as a single layer or a multi-layer that is made of at least one of molybdenum (Mo), aluminum (Al), chromium (Cr), gold (Au), titanium (Ti), nickel (Ni), neodymium (Nd), and copper (Cu), or an alloy thereof. However, the disclosure is not limited thereto.

A first planarization layer 19 may be disposed on the second data conductive layer. The first planarization layer 19 may include an organic insulating material, for example, an organic material such as PI, and may perform a surface planarization function.

First patterns BNL1, the electrodes 21 and 22, the light-emitting elements 30, connection electrodes CNE1 and CNE2, and the second pattern BNL2 may be disposed on the first planarization layer 19. In addition, insulating layers PAS1, PAS2, PAS3, and PAS4 may be disposed on the first planarization layer 19.

The first patterns BNL1 may be disposed directly on the first planarization layer 19. The first patterns BNL1 may have a shape extending in the second direction DR2 in each subpixel SPXn, may not extend to another adjacent subpixel SPXn in the second direction DR2, and may be disposed in the emission part EMA. In addition, the first patterns BNL1 may be disposed to be spaced apart from each other in the first direction DR1, and the light-emitting element 30 may be disposed therebetween. The first patterns BNL1 may be disposed for each subpixel SPXn to form a linear pattern in the display area DPA of the display device 10. FIG. 5 illustrates two first patterns BNL1, but the disclosure is not limited thereto. More first patterns BNL1 may be disposed according to the number of the electrodes 21 and 22.

The first pattern BNL1 may have a structure in which at least a portion thereof protrudes from an upper surface of the first planarization layer 19. The protruding portion of the first pattern BNL1 may have an inclined side surface, and light emitted from the light-emitting element 30 may be reflected from the electrodes 21 and 22 disposed on the first patterns BNL1 and may be emitted in an upward direction of the first planarization layer 19. The first pattern BNL1 may provide an area in which the light-emitting element 30 is disposed, and may serve as a reflective partition wall that reflects light emitted from the light-emitting element 30 upward. The side surface of the first pattern BNL1 may be inclined in a linear shape, but the disclosure is not limited thereto. The first pattern BNL1 may have an outer surface that has a curved semi-circular or semi-elliptical shape. The first patterns BNL1 may include an organic insulating material such as PI, but the disclosure is not limited thereto.

The electrodes 21 and 22 may be disposed on the first patterns BNL1 and the first planarization layer 19. The electrodes 21 and 22 may include the first electrode 21 and the second electrode 22. The first electrode 21 and the second electrode 22 may extend in the second direction DR2 and may be disposed to be spaced apart from each other in the first direction DR1.

The first electrode 21 and the second electrode 22 may each extend in the second direction DR2 in the subpixel SPXn and may be separated from other electrodes 21 and 22 in the cutout part CBA. For example, the cutout part CBA may be disposed between the emission parts EMA of the adjacent subpixels SPXn in the second direction DR2. In the cutout part CBA, the first electrode 21 and the second electrode 22 may be separated from other first and second electrodes 21 and 22 disposed in the adjacent subpixel SPXn in the second direction DR2. However, the disclosure is not limited thereto, and some of the electrodes 21 and 22 may not be separated for each subpixel SPXn and may be disposed to extend beyond the adjacent subpixel SPXn in the second direction DR2, or only one of the first electrode 21 and the second electrode 22 may be separated.

The first electrode 21 may be electrically connected to the first transistor T1 through a first contact hole CT1, and the second electrode 22 may be electrically connected to the second voltage line VL2 through a second contact hole CT2. For example, the first electrode 21 may contact the first conductive pattern CDP through the first contact hole CT1 passing through the first planarization layer 19 at a portion of the second pattern BNL2 extending in the first direction DR1. The second electrode 22 may also contact the second voltage line VL2 through the second contact hole CT2 passing through the first planarization layer 19 at the portion of the second pattern BNL2 extending in the first direction DR1. However, the disclosure is not limited thereto. In an embodiment, the first contact hole CT1 and the second contact hole CT2 may be disposed in the emission part EMA surrounded by the second pattern BNL2 so as to not overlap the second pattern BNL2. In an embodiment, the second electrode 22 may directly contact a first data line layer so that a voltage may be applied thereto.

Although FIG. 4 illustrates that a first electrode 21 and a second electrode 22 are disposed for each subpixel SPXn, the disclosure is not limited thereto, and the numbers of the first and second electrodes 21 and 22 disposed for each subpixel SPX may be greater. In addition, the first electrode 21 and the second electrode 22 disposed in each subpixel SPXn may not necessarily have a shape extending in a direction, and the first electrode 21 and the second electrode 22 may be disposed in various structures. For example, the first electrode 21 and the second electrode 22 may have a partially curved or bent shape, and one electrode thereof may be disposed to surround another electrode.

The first electrode 21 and the second electrode 22 may each be disposed directly on the first pattern BNL1. Each of the first electrode 21 and the second electrode 22 may be formed to have a width that is greater than that of the first pattern BNL1. For example, the first electrode 21 and the second electrode 22 may each be disposed to cover an outer surface of the first pattern BNL1. The first electrode 21 and the second electrode 22 may each be disposed on the side surface of the first pattern BNL1, and an interval between the first electrode 21 and the second electrode 22 may be smaller than an interval between the first patterns BNL1. In addition, at least partial areas of the first electrode 21 and the second electrode 22 may be disposed directly on the first planarization layer 19 and disposed to be coplanar with each other. However, the disclosure is not limited thereto. In some embodiments, each of the electrodes 21 and 22 may have the width that is smaller than that of the first pattern BNL1. However, each of the electrodes 21 and 22 may be disposed to at least cover a side surface of the first pattern BNL1 to reflect light emitted from the light-emitting element 30.

Each of the electrodes 21 and 22 may include a conductive material having high reflectance. For example, as the conductive material having high reflectance, each of the electrodes 21 and 22 may include a metal such as silver (Ag), copper (Cu), or aluminum (Al), or an alloy including aluminum (Al), nickel (Ni), lanthanum (La), or the like. Each of the electrodes 21 and 22 may reflect light, which is emitted from the light-emitting element 30 and travels toward the side surface of the first pattern BNL1, in an upward direction of each subpixel SPXn.

However, the disclosure is not limited thereto, and each of the electrodes 21 and 22 may further include a transparent conductive material. For example, each of the electrodes 21 and 22 may include a material such as ITO, IZO, or indium tin zinc oxide (ITZO). In some embodiments, each of the electrodes 21 and 22 may have a structure in which each of a transparent conductive material and a metal layer having high reflectance is stacked as one or more layers or may be formed as a layer including the transparent conductive material and the metal layer having high reflectance. For example, each of the electrodes 21 and 22 may have a stacked structure such as ITO/Ag/ITO, ITO/Ag/IZO, or ITO/Ag/ITZO/IZO.

The electrodes 21 and 22 may be electrically connected to the light-emitting elements 30, and a voltage may be applied thereto such that the light-emitting elements 30 emit light. The electrodes 21 and 22 may be electrically connected to the light-emitting elements 30 through the connection electrodes CNE1 and CNE2 and may transmit electrical signals, which are applied to the electrodes 21 and 22, to the light-emitting elements 30 through the connection electrodes CNE1 and CNE2.

One of the first electrode 21 and the second electrode 22 may be electrically connected to an anode of the light-emitting element 30, and the other thereof may be electrically connected to a cathode of the light-emitting element 30. However, the disclosure is not limited thereto, and the reverse may well be the case.

In addition, each of the electrodes 21 and 22 may be used to form an electric field in the subpixel SPXn in order to arrange the light-emitting elements 30. The light-emitting elements 30 may be disposed between the first electrode 21 and the second electrode 22 by an electric field formed between the first electrode 21 and the second electrode 22. The light-emitting elements 30 of the display device 10 may be sprayed on the electrodes 21 and 22 by an inkjet printing process. In case that an ink including the light-emitting elements 30 is sprayed on the electrodes 21 and 22, an arrangement signal is applied to the electrodes 21 and 22 to generate an electric field. The light-emitting elements 30 dispersed in the ink may be arranged on the electrodes 21 and 22 by receiving a dielectrophoretic force by an electric field generated between the electrodes 21 and 22.

A first insulating layer PAS1 may be disposed on the first planarization layer 19. The first insulating layer PAS1 may be disposed to cover the first patterns BNL1, the first electrode 21, and the second electrode 22. The first insulating layer PAS1 may protect the first electrode 21 and the second electrode 22 and insulate the first electrode 21 and the second electrode 22 from each other. In addition, the first insulating layer PAS1 may prevent the light-emitting element 30, disposed on the first insulating layer PAS1, from being damaged by directly contacting other members.

In an embodiment, the first insulating layer PAS1 may include openings OP partially exposing the first electrode 21 and the second electrode 22. Each opening OP may partially expose a portion of each of the electrodes 21 and 22 disposed on upper surfaces of the first patterns BNL1. Portions of the connection electrodes CNE1 and CNE2 may contact the electrodes 21 and 22 exposed through the openings OP, respectively.

A portion of an upper surface of the first insulating layer PAS1 may be recessed to form a stepped portion between the first electrode 21 and the second electrode 22. For example, the first insulating layer PAS1 may be disposed to cover (or overlap, e.g., in a plan view) the first electrode 21 and the second electrode 22 so that the upper surface thereof may be stepped according to the shape of the electrodes 21 and 22 disposed below the first insulating layer PAS1. However, the disclosure is not limited thereto.

The second pattern BNL2 may be disposed on the first insulating layer PAS1. The second pattern BNL2 may include parts extending in the first direction DR1 and the second direction DR2 in a plan view and may be disposed in a grid pattern in an entire surface of the display area DPA.

The second pattern BNL2 may be disposed over boundaries of the subpixels SPXn to distinguish the adjacent subpixels SPXn.

In addition, the second pattern BNL2 may be disposed to surround the emission part EMA and the cutout part CBA disposed for each subpixel SPXn to distinguish the emission part EMA and the cutout part CBA. The first electrode 21 and the second electrode 22 may extend in the second direction DR2 and may be disposed across the portion of the second pattern BNL2 which extends in the first direction DR1. In a portion of the second pattern BNL2 extending in the second direction DR2, a portion thereof disposed between the emission parts EMA may have a width greater than that of a portion thereof disposed between the cutout parts CBA. Therefore, an interval between the cutout parts CBA may be smaller than an interval between the emission parts EMA.

The second pattern BNL2 may be formed to have a height greater than that of the first pattern BNL1. The second pattern BNL2 may prevent inks from overflowing to the adjacent subpixels SPXn in an inkjet printing process of the manufacturing process of the display device 10, thereby separating the inks, in which different light-emitting elements 30 are dispersed for different subpixels SPXn, so as not to be mixed with each other. Similar to the first pattern BNL1, the second pattern BNL2 may include PI, but the disclosure is not limited thereto.

The light-emitting elements 30 may be disposed on the first insulating layer PAS1. The light-emitting elements 30 may be disposed to be spaced apart from each other in the second direction DR2 in which each of the electrodes 21 and 22 extends, and may be arranged substantially parallel to each other. The light-emitting element 30 may have a shape extending in a direction, and the extending direction of the light-emitting element 30 may be substantially perpendicular to the extending direction of each of the electrodes 21 and 22. However, the disclosure is not limited thereto, and the light-emitting element 30 may be disposed to be inclined without being perpendicular to the extending direction of each of the electrodes 21 and 22.

The light-emitting elements 30 disposed in each subpixel SPXn may include light-emitting layers 36 (see FIG. 6) including different materials to emit light having different wavelengths to the outside. Accordingly, light having the first color, light having the second color, and light having the third color may be emitted from the first subpixel SPX1, the second subpixel SPX2, and the third subpixel SPX3, respectively. However, the disclosure is not limited thereto, and each of the subpixels SPXn may include a same type of the light-emitting elements 30 to emit substantially light having a same color.

End portions of the light-emitting element 30 may be disposed on the electrodes 21 and 22 between the first patterns BNL1. An extended length of the light-emitting element 30 may be greater than the interval between the first electrode 21 and the second electrode 22, and end portions of the light-emitting element 30 may be disposed on the first electrode 21 and the second electrode 22. For example, the light-emitting element 30 may be disposed such that an end portion thereof is placed on the first electrode 21 and another end portion thereof is placed on the second electrode 22.

In the light-emitting element 30, layers may be disposed in a direction perpendicular to an upper surface of the substrate 11 or the first planarization layer 19. The light-emitting element 30 may be disposed such that a direction in which the light-emitting element 30 extends is parallel to the upper surface of the first planarization layer 19, and semiconductor layers included in the light-emitting element 30 may be sequentially disposed in a direction parallel to the upper surface of the first planarization layer 19. However, the disclosure is not limited thereto, and in case that the light-emitting element 30 has a different structure, the semiconductor layers may be disposed in the direction perpendicular to the upper surface of the first planarization layer 19.

End portions of the light-emitting element 30 may contact the connection electrodes CNE1 and CNE2. For example, an insulating film 38 (see FIG. 6) may not be formed on a surface of an end portion of the light-emitting element 30 in a direction in which the light-emitting element 30 extends, and thus, a portion of a semiconductor layer 31 or 32 (see FIG. 6) or an electrode layer 37 (see FIG. 6) may be exposed. The exposed semiconductor layer 31 or 32 (see FIG. 6) or the exposed electrode layer 37 (see FIG. 6) may contact the connection electrode CNE1 or CNE2. However, the disclosure is not limited thereto, and at least partial areas of the insulating film 38 may be removed from the light-emitting element 30 to partially expose side surfaces of end portions of the semiconductor layers 31 and 32 (see FIG. 6). The exposed side surfaces of the semiconductor layers 31 and 32 (see FIG. 6) may directly contact the connection electrodes CNE1 and CNE2.

A second insulating layer PAS2 may be disposed on a portion of the light-emitting element 30. For example, the second insulating layer PAS2 may have a width smaller than a length of the light-emitting element 30 and may be disposed on the light-emitting element 30 to surround the light-emitting element 30 such that end portions of the light-emitting elements 30 are exposed. In the manufacturing process of the display device 10, the second insulating layer PAS2 may be disposed to cover the light-emitting element 30, the electrodes 21 and 22, and the first insulating layer PAS1 and may be removed to expose end portions of the light-emitting element 30. The second insulating layer PAS2 may be disposed on the first insulating layer PAS1 to extend in the second direction DR2 in a plan view, thereby forming a linear or island-shaped pattern in each subpixel SPXn. The second insulating layer PAS2 may protect the light-emitting element 30 and fix the light-emitting element 30 in the manufacturing process of the display device 10.

The connection electrodes CNE1 and CNE2 and a third insulating layer PAS3 may be disposed on the second insulating layer PAS2.

The connection electrodes CNE1 and CNE2 may have a shape extending in a direction and may be disposed on the electrodes 21 and 22, respectively. The connection electrodes CNE1 and CNE2 may include a first connection electrode CNE1 disposed on the first electrode 21 and a second connection electrode CNE2 disposed on the second electrode 22. The connection electrodes CNE1 and CNE2 may be disposed to be spaced apart from or face each other. For example, the first connection electrode CNE1 and the second connection electrode CNE2 may be respectively disposed on the first electrode 21 and the second electrode 22 and may be spaced apart from each other in the first direction DR1. Each of the connection electrodes CNE1 and CNE2 may form a stripe pattern in the emission part EMA of each subpixel SPXn.

Each of the connection electrodes CNE1 and CNE2 may contact the light-emitting element 30. The first connection electrode CNE1 may contact end portions of the light-emitting elements 30, and the second connection electrode CNE2 may contact other end portions of the light-emitting elements 30. The semiconductor layers of the light-emitting element 30 may be exposed at surfaces of end portions of the light-emitting element 30 in the extending direction of the light-emitting element 30, and the connection electrodes CNE1 and CNE2 may contact the semiconductor layers of the light-emitting element 30 and may be electrically connected thereto. Sides of the connection electrodes CNE1 and CNE2 contacting end portions of the light-emitting element 30 may be disposed on the second insulating layer PAS2. In addition, the first connection electrode CNE1 may contact the first electrode 21 through the opening OP exposing a portion of an upper surface of the first electrode 21, and the second connection electrode CNE2 may contact the second electrode 22 through the opening OP exposing a portion of an upper surface of the second electrode 22.

Each of the connection electrodes CNE1 and CNE2 may have a smaller width measured in a direction than each of the electrodes 21 and 22 measured in the direction. The connection electrodes CNE1 and CNE2 may be disposed so as to contact an end portion and another end portion of the light-emitting element 30 and cover portions of the upper surfaces of the first electrode 21 and the second electrode 22, respectively. However, the disclosure is not limited thereto, and the connection electrodes CNE1 and CNE2 may be formed to have a greater width than the electrodes 21 and 22 and to cover sides of the electrodes 21 and 22.

The connection electrodes CNE1 and CNE2 may include a transparent conductive material. For example, the connection electrodes CNE1 and CNE2 may include ITO, IZO, ITZO, aluminum (Al), or the like. Light emitted from the light-emitting element 30 may pass through the connection electrodes CNE1 and CNE2 and travel toward the electrodes 21 and 22. However, the disclosure is not limited thereto.

FIG. 4 illustrates two connection electrodes CNE1 and CNE2 are disposed in a subpixel SPXn, but the disclosure is not limited thereto. The number of the connection electrodes CNE1 and CNE2 may vary according to the number of the electrodes 21 and 22 disposed for each subpixel SPXn.

The third insulating layer PAS3 may be disposed to cover the first connection electrode CNE1. The third insulating layer PAS3 may be disposed to cover the first connection electrode CNE1 and a side at which the first connection electrode CNE1 is disposed with respect to the second insulating layer PAS2. For example, the third insulating layer PAS3 may be disposed to cover the first connection electrode CNE1 and the first insulating layers PAS1 disposed on the first electrode 21. Such an arrangement may be performed in a process of arranging an insulating material layer (or insulating layer) forming the third insulating layer PAS3 in the entirety of the emission part EMA and partially removing the insulating material layer to form the second connection electrode CNE2. In the above process, the insulating material layer forming the third insulating layer PAS3 may be removed together with an insulating material layer forming the second insulating layer PAS2, and a side of the third insulating layer PAS3 may be aligned with a side of the second insulating layer PAS2. A side of the second connection electrode CNE2 may be disposed on the third insulating layer PAS3 and may be insulated from the first connection electrode CNE1 with the third insulating layer PAS3 interposed therebetween.

A fourth insulating layer PAS4 may be disposed in the entirety of the display area DPA of the substrate 11. The fourth insulating layer PAS4 may perform a function of protecting members, disposed on the substrate 11, from an external environment. However, the fourth insulating layer PAS4 may be omitted.

Each of the first insulating layer PAS1, the second insulating layer PAS2, the third insulating layer PAS3, and the fourth insulating layer PAS4 may include an inorganic insulating material or an organic insulating material. For example, the first insulating layer PAS1, the second insulating layer PAS2, the third insulating layer PAS3, and the fourth insulating layer PAS4 may include an inorganic insulating material such as silicon oxide ($SiO_x$), silicon nitride ($SiN_x$), silicon oxynitride ($SiO_xN_y$), aluminum oxide ($Al_xO_y$), or aluminum nitride (AlN). As another example, the first insulating layer PAS1, the second insulating layer PAS2, the third insulating layer PAS3, and the fourth insulating layer PAS4 may include an organic insulating material such as an acrylic resin, an epoxy resin, a phenol resin, a polyamide resin, a PI resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate (PC), or a polymethyl methacrylate-polycarbonate synthetic resin. However, the disclosure is not limited thereto.

Figure 6:
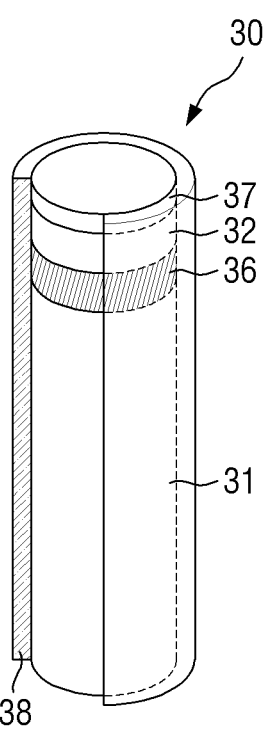
FIG. 6 is a schematic view of a light-emitting element according to an embodiment.

FIG. 6 is a schematic view of a light-emitting element according to an embodiment.

Referring to FIG. 6, a light-emitting element 30 may be a particulate element and may have a rod-like or cylindrical shape having an aspect ratio (e.g., a predetermined or selected aspect ratio). The light-emitting element 30 may have a size ranging from a nanometer scale (about 1 nm or more and less than about 1 μm) to a micrometer scale (about 1 μm or more and less than about 1 mm). In an embodiment, both of a diameter and length of the light-emitting element 30 may have a size on a nanometer scale or a size on a micrometer scale. In some embodiments, the diameter of the light-emitting element 30 may have a size on a nanometer scale, and the length of the light-emitting element 30 may have a size on a micrometer scale. In some embodiments, the diameter and/or length of some light-emitting elements 30 may have a size on a nanometer scale, and the diameter and/or length of other light-emitting elements 30 may have a size on a micrometer scale.

In an embodiment, the light-emitting element 30 may be an inorganic light-emitting diode. Specifically, the light-emitting element 30 may include semiconductor layers doped with arbitrary conductivity-type (for example, a p-type or n-type) impurities. The semiconductor layer may emit light at a specific wavelength by receiving an electrical signal applied from an external power source.

The light-emitting element 30 according to an embodiment may include a first semiconductor layer 31, a light-emitting layer 36, a second semiconductor layer 32, and an electrode layer 37 which are sequentially stacked in a length direction of the light-emitting element 30. The light-emitting element may further include an insulating film 38 surrounding outer surfaces of the first semiconductor layer 31, the second semiconductor layer 32, and the light-emitting layer 36.

The first semiconductor layer 31 may be an n-type semiconductor. In case that the light-emitting element 30 emits light having a blue wavelength, the first semiconductor layer 31 may include a semiconductor material having a formula of $Al_xGa_yIn_{1-x-y}N$ ($0 \leq x \leq 1$, $0 \leq y \leq 1$, and $0 \leq x+y \leq 1$). For example, the first semiconductor layer 31 may include at least one selected from among AlGaInN, GaN, AlGaN, InGaN, AlN, and InN which are n-type doped. The first semiconductor layer 31 may be doped with an n-type dopant, and the n-type dopant may be silicon (Si), germanium (Ge), tin (Sn), or the like. For example, the first semiconductor layer 31 may include n-GaN doped with n-type Si. The first semiconductor layer 31 may have a length ranging from about 1.5 μm to about 5 μm, but the disclosure is not limited thereto.

The second semiconductor layer 32 may be disposed on a light-emitting layer 36 to be described below. The second semiconductor layer 32 may be a p-type semiconductor, and in case that the light-emitting element 30 emits light having a blue or green wavelength, the second semiconductor layer 32 may include a semiconductor material having a formula of $Al_xGa_yIn_{1-x-y}N$ ($0 \leq x \leq 1$, $0 \leq y \leq 1$, and $0 \leq x+y \leq 1$). For example, the second semiconductor layer 32 may include at least one selected from among AlGaInN, GaN, AlGaN, InGaN, AlN, and InN which are p-type doped. The second semiconductor layer 32 may be doped with a p-type dopant, and the p-type dopant may be magnesium (Mg), zinc (Zn), calcium (Ca), selenium (Se), barium (Ba), or the like. For example, the second semiconductor layer 32 may include p-GaN doped with p-type Mg. The second semiconductor layer 32 may have a length ranging from about 0.05 μm to about 0.10 μm, but the disclosure is not limited thereto.

FIG. 6 illustrates that the first semiconductor layer 31 and the second semiconductor layer 32 are formed as a layer, but the disclosure is not limited thereto. The first semiconductor layer 31 and the second semiconductor layer 32 may further include more layers, for example, a clad layer or a tensile strain barrier reducing (TSBR) layer according to a material of the light-emitting layer 36.

The light-emitting layer 36 may be disposed between the first semiconductor layer 31 and the second semiconductor layer 32. The light-emitting layer 36 may include a material having a single or multi-quantum well structure. In case that the light-emitting layer 36 includes a material having a multi-quantum well structure, the light-emitting layer 36 may have a structure in which quantum layers and well layers are alternately stacked. The light-emitting layer 36 may emit light by combination (or recombination) of an electron-hole pair according to an electrical signal applied through the first semiconductor layer 31 and the second semiconductor layer 32. In case that the light-emitting layer 36 emits light having a blue wavelength, the light-emitting layer 36 may include a material such as AlGaN or AlGaInN. In particular, in case that the light-emitting layer 36 has a structure in which quantum layers and well layers are alternately stacked in a multi-quantum well structure, the quantum layer may include a material such as AlGaN or AlGaInN, and the well layer may include a material such as GaN or AlInN. For example, the light-emitting layer 36 may include AlGaInN as the quantum layer and AlInN as the well layer. Thus, as described above, the light-emitting layer 36 may emit blue light having a central wavelength ranging from about 450 nm to about 495 nm.

However, the disclosure is not limited thereto, and the light-emitting layer 36 may have a structure in which a semiconductor material having high band gap energy and a semiconductor material having low band gap energy are alternately stacked or may include other Group III-V semiconductor materials according to a wavelength of emitted light. Light emitted by the light-emitting layer 36 is not limited to light having a blue wavelength, and in some embodiments, the light-emitting layer 36 may emit light having a red or green wavelength. The light-emitting layer 36 may have a length ranging from about 0.05 μm to about 0.10 μm, but the disclosure is not limited thereto.

Light emitted from the light-emitting layer 36 may be emitted not only to an outer surface of the light-emitting element 30 in the length direction thereof but also to side surfaces of the light-emitting element 30. The directionality of the light emitted from the light-emitting layer 36 is not limited to a direction.

The electrode layer 37 may be an ohmic connection electrode. However, the disclosure is not limited thereto, and the electrode layer 37 may be a Schottky connection electrode. The light-emitting element 30 may include at least one electrode layer 37. FIG. 6 illustrates that the light-emitting element 30 includes an electrode layer 37, but the disclosure is not limited thereto. In some embodiments, the light-emitting element 30 may include more electrode layers 37, or the electrode layer 370 may be omitted. Even in case that the number of the electrode layers 37 varies or other structures are further included, the same may be applied to the description of the light-emitting element 30 to be described below.

In a display device 10 according to an embodiment, in case that the light-emitting element 30 is electrically connected to an electrode or a connection electrode, the electrode layer 37 may reduce resistance between the light-emitting element 30 and the electrode or the connection electrode. The electrode layer 37 may include a material having conductivity. For example, the electrode layer 37 may include at least one selected from among aluminum (Al), titanium (Ti), indium (In), gold (Au), silver (Ag), ITO, IZO, and ITZO. Furthermore, the electrode layer 37 may include a semiconductor material that is n-type or p-type doped. The electrode layers 37 may include a same material or different materials, but the disclosure is not limited thereto.

The insulating film 38 may be disposed to surround outer surfaces of the semiconductor layers and electrode layers described above. For example, the insulating film 38 may be disposed to surround at least an outer surface of the light-emitting layer 36 and may extend in a direction in which the light-emitting element 30 extends. The insulating film 38 may perform a function of protecting such members. The insulating film 38 may be formed to surround side surfaces of the members and may be formed to expose end portions of the light-emitting element 30 in the length direction thereof.

FIG. 6 illustrates that the insulating film 38 is formed to extend in the length direction of the light-emitting element 30 and to cover the side surfaces from the first semiconductor layer 31 to the electrode layer 37, but the disclosure is not limited thereto. The insulating film 38 may cover only the outer surfaces of the light-emitting layer 36 and some of the semiconductor layers or may cover only a portion of the outer surface of the electrode layer 37 to partially expose the outer surface of each electrode layer 37. In addition, the insulating film 38 may have a rounded upper surface in a cross-sectional view in an area adjacent to at least one end portion of the light-emitting element 30.

The insulating film 38 may have a thickness ranging from about 10 nm to about 1.0 μm, but the disclosure is not limited thereto. The insulating film 38 may have a thickness of about 40 nm.

The insulating film 38 may include at least one selected from among materials having insulating properties, for example, silicon oxide ($SiO_x$), silicon nitride ($SiN_x$), silicon oxynitride ($SiO_xN_y$), aluminum nitride (AlN), and aluminum oxide ($Al_xO_y$). The insulating film 38 may be formed as a single layer or a multi-layer formed of the materials having insulating properties. Accordingly, it is possible to prevent an electrical short circuit that may occur in case that the light-emitting layer 36 directly contacts an electrode through which an electrical signal is transmitted to the light-emitting element 30. In addition, since the insulating film 38 protects the outer surface of the light-emitting element 30 including the light-emitting layer 36, it is possible to prevent a decrease in luminous efficiency.

In addition, an outer surface of the insulating film 38 may be surface-treated. The light-emitting element 30 may be sprayed and arranged on an electrode in a state of being dispersed in an ink. Here, in order for the light-emitting element 30 to remain dispersed without being aggregated with other adjacent light-emitting element 30 in the ink, the surface of the insulating film 38 may be treated to be hydrophobic or hydrophilic. For example, the outer surface of the insulating film 38 may be surface-treated with a material such as a stearic acid or a 2,3-naphthalene dicarboxylic acid.

In the display device 10, a printed circuit board COF may be coupled to a pad part PDA of a non-display area NDA, and a frame DF covering the pad part PDA may be disposed. A cover layer COL, which is disposed on the printed circuit board COF to enhance a delamination force between the printed circuit board COF and the substrate 11 and prevent moisture permeation, may be disposed on the pad part PDA. The cover layer COL may be formed by being applied on the pad part PDA and cured with ultraviolet (UV) light. However, since the frame DF surrounds the cover layer COL, UV light may not reach an inner side of the cover layer COL, and thus the cover layer COL may not be cured. Thus, a delamination force between the printed circuit board COF and the pad part PDA may be weakened, and moisture permeation may occur.

Hereinafter, a display device 10 capable of preventing the non-curing of a cover layer COL of the display device 10 will be described.

Figure 7:
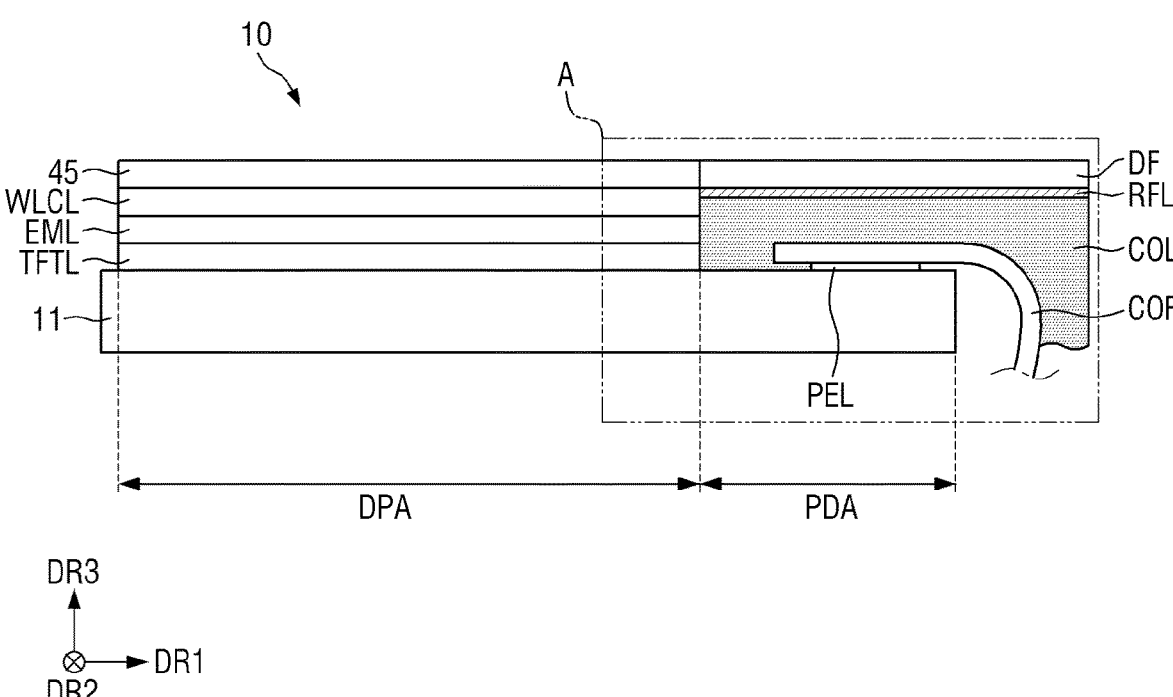
FIG. 7 is a schematic cross-sectional view taken along line AA-AA' of FIG. 1 which illustrates a display device.
Figure 8:
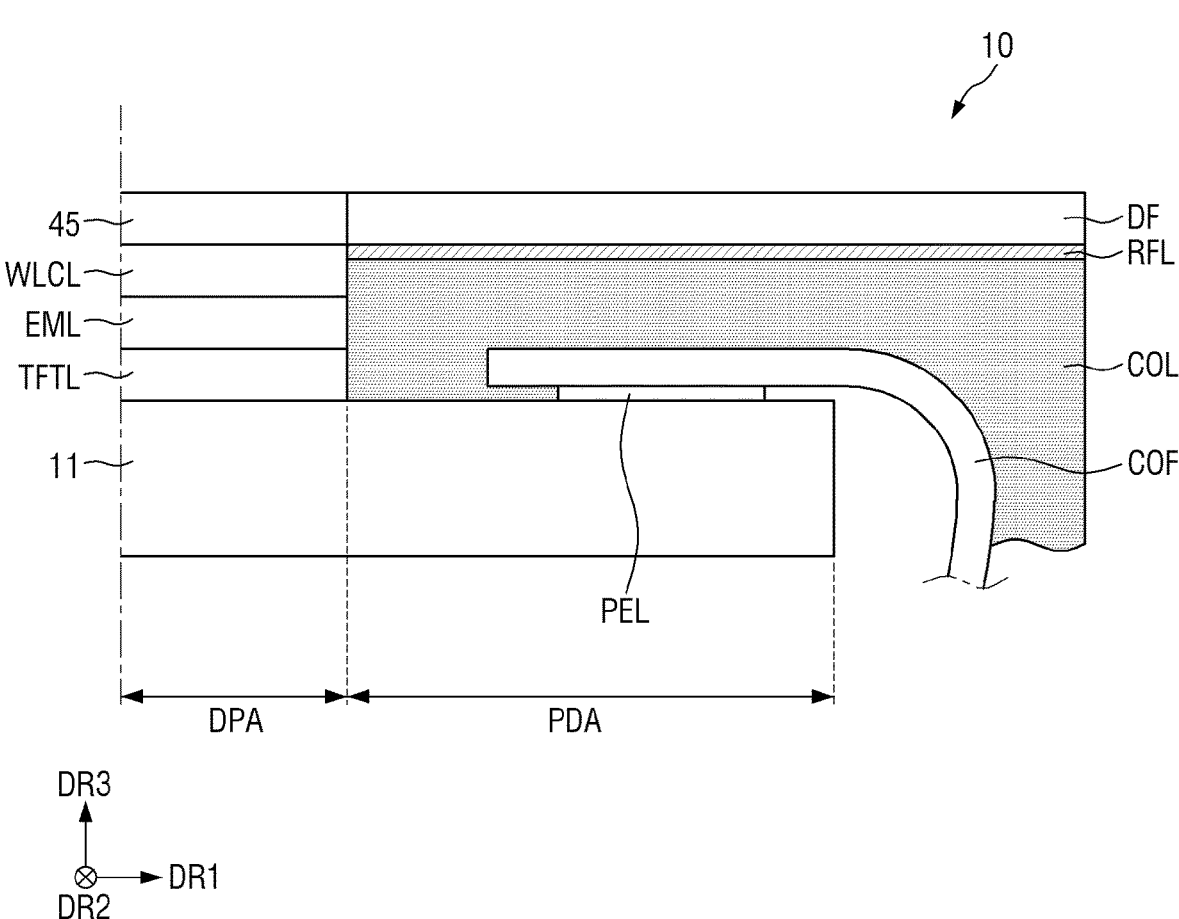
FIG. 8 is a schematic enlarged view of area A of FIG. 7.
Figure 9:
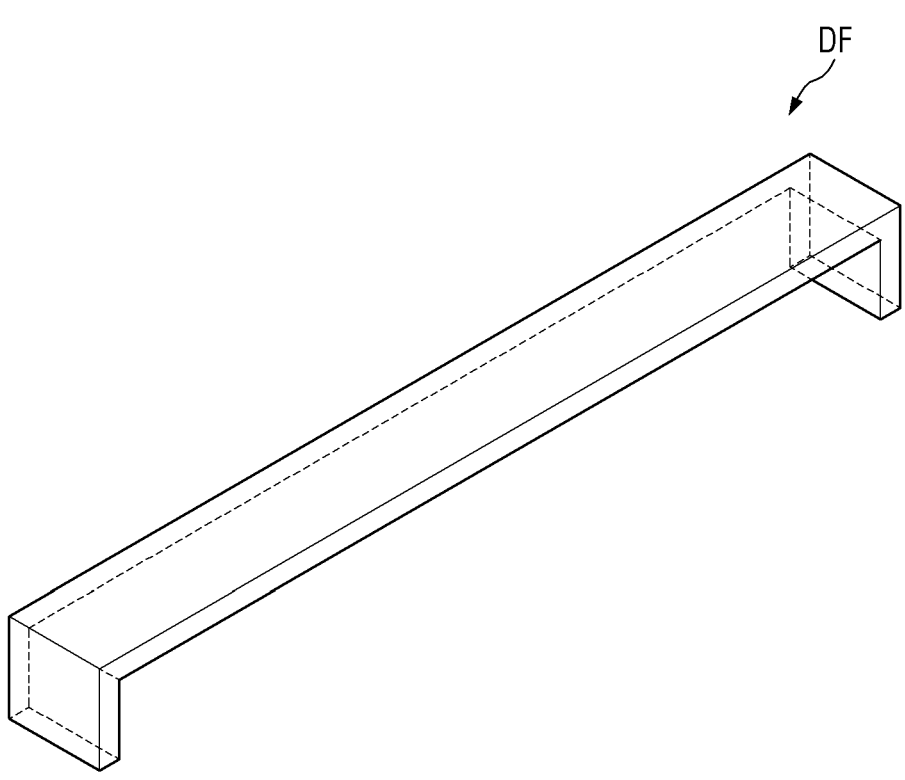
FIG. 9 is a schematic perspective view illustrating a frame.
Figure 10:
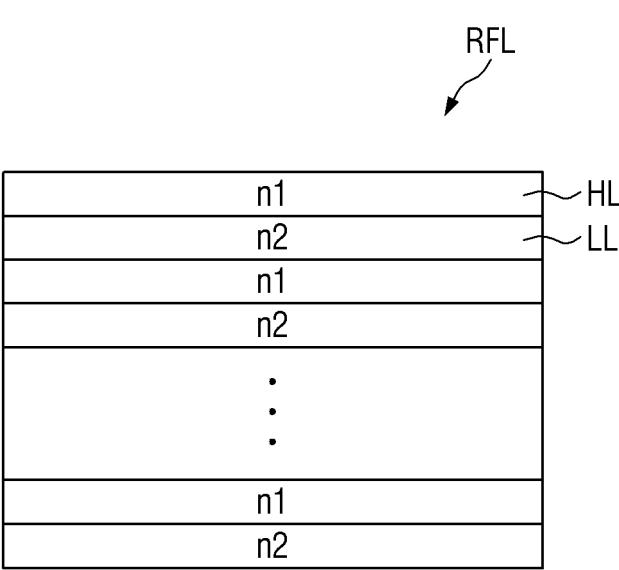
FIG. 10 is a schematic cross-sectional view illustrating a reflective layer of the display device according to an embodiment.
Figure 11:
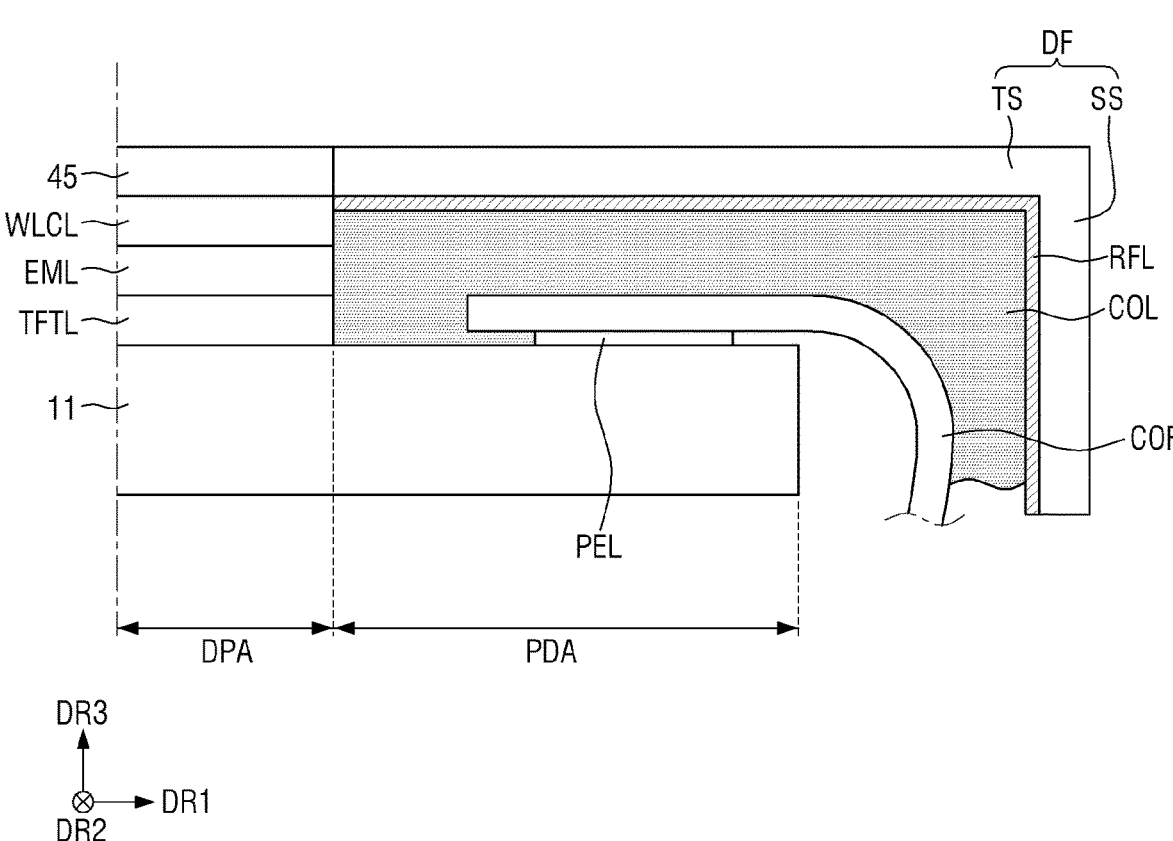
FIG. 11 is a schematic cross-sectional view illustrating a modified example of the display device according to an embodiment.

FIG. 7 is a schematic cross-sectional view taken along line AA-AA' of FIG. 1 which illustrates a display device. FIG. 8 is a schematic enlarged view of area A of FIG. 7. FIG. 9 is a schematic perspective view illustrating a frame. FIG. 10 is a schematic cross-sectional view illustrating a reflective layer of the display device according to an embodiment. FIG. 11 is a schematic cross-sectional view illustrating a modified example of the display device according to an embodiment.

Referring to FIGS. 7 to 10, in a display device 10 according to an embodiment, a transistor layer TFTL, a light-emitting element layer EML, a wavelength conversion layer WLCL, and an anti-reflection member 45 may be disposed on a substrate 11. The transistor layer TFTL, the light-emitting element layer EML, the wavelength conversion layer WLCL, and the anti-reflection member 45 may be disposed in a display area DPA of the substrate 11.

A pad electrode layer PEL, a printed circuit board COF, a cover layer COL, and a frame DF may be disposed on a pad part PDA of the substrate 11. Pad electrode layers PEL may be disposed on the substrate 11. The printed circuit board COF may be coupled to the pad electrode layer PEL. The printed circuit board COF and the pad electrode layer PEL may be coupled by an adhesive conductive member such as an anisotropic conductive film (ACF). A portion of the printed circuit board COF may extend to overlap the pad part PDA of the substrate 11. The remaining portion of the printed circuit board COF may extend outward from the substrate 11 and may be flexibly bent. The remaining portion of the printed circuit board COF may be connected to a main circuit board.

The frame DF may be disposed on the pad part PDA of the substrate 11. The frame DF may prevent the pad part PDA of the substrate 11 from being viewed. Specifically, the frame DF may prevent the pad electrode layer PEL and the printed circuit board COF disposed on the pad part PDA from being viewed. To this end, the frame DF may overlap the pad part PDA and may cover the printed circuit board COF coupled to the pad electrode layer PEL.

In order to prevent the pad part PDA from being viewed by a user, the frame DF may be made of a material capable of absorbing or blocking light. For example, the frame DF may be made of plastic including a black dye or pigment or may be made of a black metal. However, the disclosure is not limited thereto.

As shown in FIG. 9, the frame DF may have a bar shape of which end portions are bent. A cross-sectional shape of the frame DF in a direction perpendicular to a length direction of the frame DF may be a bar shape. The frame DF may contact a side surface of the anti-reflection member 45. However, the disclosure is not limited thereto, and the frame DF and the anti-reflection member 45 may be spaced apart from each other. An upper surface of the frame DF and an upper surface of the anti-reflection member 45 may be aligned to be coplanar with each other. In an embodiment, the upper surface of the frame DF may be disposed to be closer to the substrate 11 than the upper surface of the anti-reflection member 45 or may be disposed to protrude more in a third direction DR3 than the upper surface of the anti-reflection member 45. End portions of the frame DF may have a shape bent in a direction intersecting the upper surface thereof such that the cover layer COL does not flow down.

The cover layer COL may be disposed between the pad part PDA of the substrate 11 and the frame DF. As described above, the cover layer COL may serve to enhance a delamination force between the printed circuit board COF and the substrate 11 and prevent moisture permeation. The cover layer COL may cover the substrate 11 and the printed circuit board COF. The cover layer COL may contact a side surface of at least one of the transistor layer TFTL, the light-emitting element layer EML, and the wavelength conversion layer WLCL disposed on the substrate 11 and may contact the substrate 11. In addition, the cover layer COL may contact a side surface of the printed circuit board COF and an upper surface thereof overlapping the pad part PDA. An outer side of the cover layer COL may be aligned to be coplanar with an outer side of the frame DF. The cover layer COL may be cured with UV light to form a shape as shown in FIG. 8.

The cover layer COL may include a resin. The cover layer COL may include, for example, a transparent organic resin, and the organic resin may be a UV-curable adhesive material. The organic resin may be a material that is cured by UV light. In an embodiment, the organic resin may include a polymer, an oligomer, a monomer, or the like. However, the disclosure is not limited thereto.

In an embodiment, a reflective layer RFL may be disposed on a surface of the frame DF. The reflective layer RFL may serve to reflect UV light for curing the cover layer COL. The reflective layer RFL may be disposed directly on a surface of the frame DF, for example, a lower surface of the frame DF facing the substrate 11.

The reflective layer RFL may include at least one selected from among an inorganic material, an organic material, and a metal so as to reflect light. In an embodiment, the reflective layer RFL may be formed as a metal layer having high reflectance. The metal layer may include a material having high reflectance, such as aluminum (Al) or silver (Ag), but the disclosure is not limited thereto. In an embodiment, the reflective layer RFL may be made of an organic material having high reflectance. The organic material may include, for example, polyethylene terephthalate (PET), PI, or PC, but the disclosure is not limited thereto.

As shown in FIG. 10, in an embodiment, the reflective layer RFL may have a multi-layered structure so as to have different refractive indices. The reflective layer RFL may have a multi-layered structure in which a high refractive index layer HL and a low refractive index layer LL are repeatedly and alternately stacked. The high refractive index layer HL may include a material having a refractive index n1 of about 2.0 or more, for example, titanium oxide ($TiO_2$). The low refractive index layer LL may include a material having a refractive index n2 of about 1.6 or less, for example, silicon oxide ($SiO_2$). However, the disclosure is not limited thereto. In the reflective layer RFL, since the high refractive index layer HL and the low refractive index layer LL are repeatedly stacked, light incident on the reflective layer RFL may be reflected by being repeatedly and totally reflected between the high refractive index layers HL and the low refractive index layers LL.

The reflective layer RFL may have a thickness (e.g., a predetermined or selected thickness) such that UV light may be irradiated onto the entirety of the cover layer COL. The reflective layer RFL may have a thickness of about 20 nm to about 1,000 nm. In case that the thickness of the reflective layer RFL is about 20 nm or more, a reflectance of the reflective layer RFL may be increased, and in case that the thickness of the reflective layer RFL is about 1,000 nm or less, a space between the reflective layer RFL and the printed circuit board COF may be secured so that UV light may be emitted at the entirety of the cover layer COL.

The cover layer COL may be cured by irradiating UV light from a side surface of the display device 10. In this case, it may be difficult for UV light to reach an area of the cover layer COL which is adjacent to the transistor layer TFTL, the light-emitting element layer EML, the wavelength conversion layer WLCL, or the anti-reflection member 45. In the embodiment, by providing the reflective layer RFL on a surface of the frame DF, UV light irradiated from the side surface of the display device 10 may be reflected between the reflective layer RFL and the printed circuit board COF. Accordingly, UV light may reach an entire area of the cover layer COL to increase a curing rate of the cover layer COL. Accordingly, it is possible to enhance a delamination force of the printed circuit board COF and prevent moisture permeation.

Referring to FIG. 11, the cross-sectional shape of the frame DF in the direction perpendicular to the length direction of the frame DF may also be a "]" shape.

Specifically, the frame DF may include an upper surface TS and a side surface SS. The upper surface TS may be a surface that is parallel to the substrate 11, and the side surface SS may be a surface that is bent in a direction opposite to the third direction DR3 intersecting the upper surface TS. The side surface SS may be a surface that faces a side surface of the substrate 11.

The reflective layer RFL may be disposed on the upper surface TS and the side surface SS of the frame DF. The reflective layer RFL may be disposed to extend from the upper surface TS to the side surface SS of the frame DF. The cover layer COL may be disposed in a shape that fills a space which is defined by the upper surface TS and the side surface SS of the frame DF, the substrate 11, and the printed circuit board COF.

In the embodiment of FIG. 11, UV light irradiated from the side surface of the substrate 11 may be reflected by the reflective layer RFL disposed on the side surface SS of the frame DF and the printed circuit board COF to reach the inside of the cover layer COL. In addition, in the inside of the cover layer COL, UV light may be reflected between the printed circuit board COF and the reflective layer RFL disposed on the upper surface TS of the frame DF to reach the entirety of the inside of the cover layer COL. Accordingly, by forming the reflective layer RFL on the upper surface TS and the side surface SS of the frame DF, UV light is irradiated onto the entirety of the cover layer COL, thereby improving the curing rate of the cover layer COL.

Figure 12:
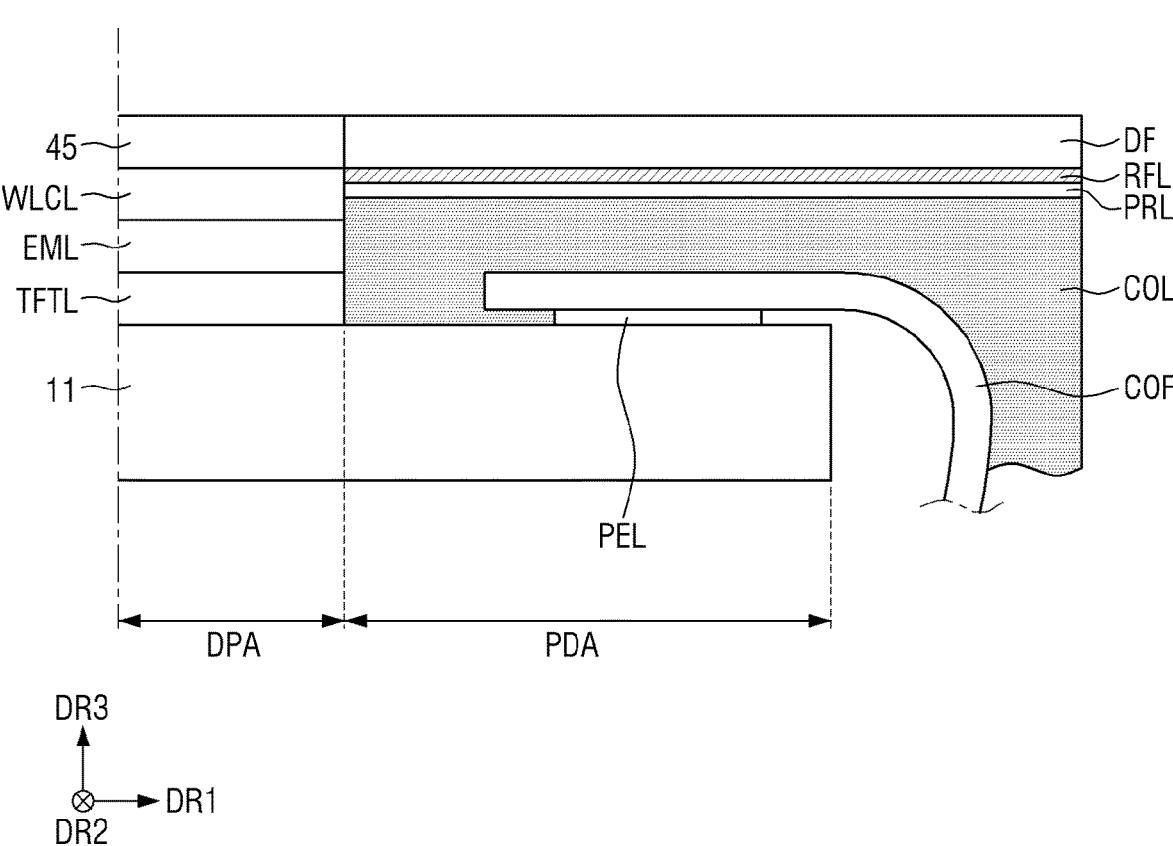
FIGS. 12 and 13 are schematic cross-sectional views illustrating a display device according to another embodiment.
Figure 13:
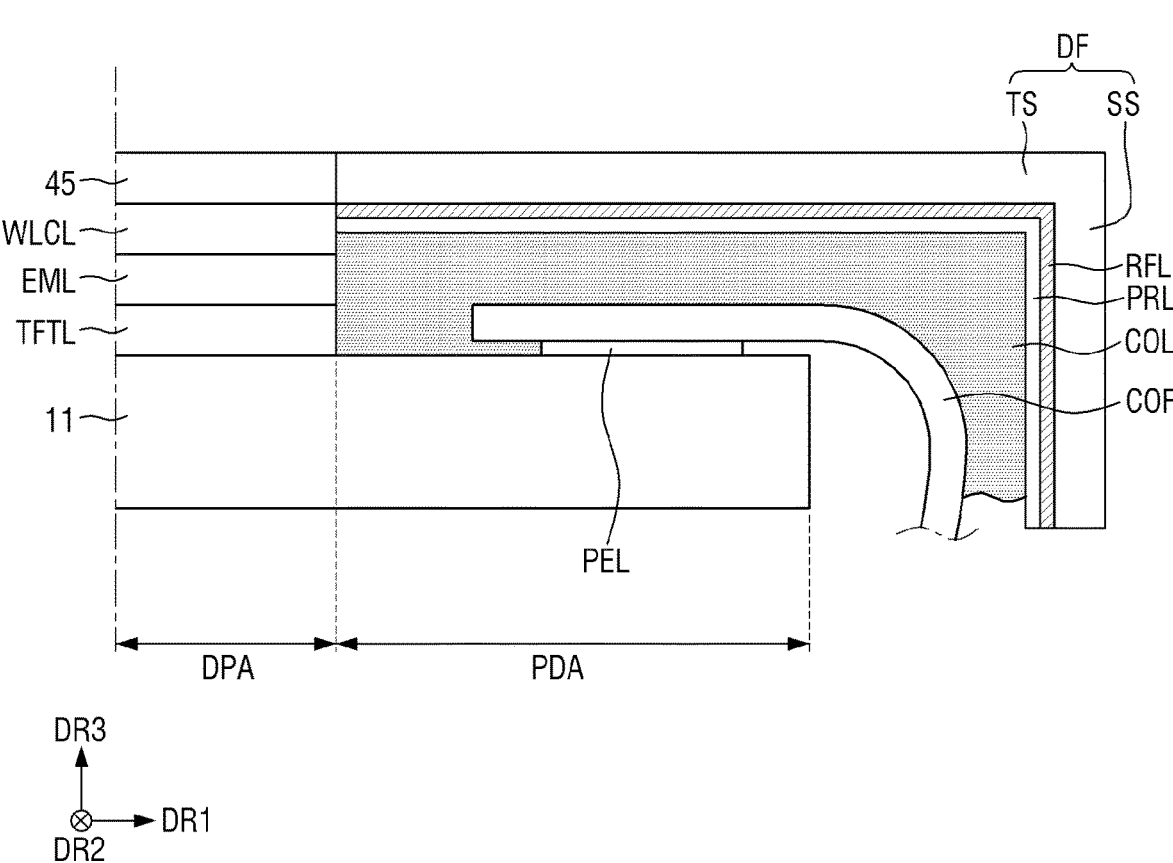

FIGS. 12 and 13 are schematic cross-sectional views illustrating a display device according to another embodiment.

Referring to FIGS. 12 and 13, the embodiment is different from the above-described embodiment of FIGS. 7 to 11 in that a protective layer PRL is further disposed on a reflective layer RFL. Hereinafter, descriptions of the same components as the above-described embodiment will be omitted, and differences will be described.

The protective layer PRL may be disposed on a surface of the reflective layer RFL. The protective layer PRL may be disposed on a surface of the reflective layer RFL, for example, a lower surface of the reflective layer RFL facing the substrate 11. The protective layer PRL may prevent a frame DF and the reflective layer RFL from being dissolved by a cover layer COL. In case that the frame DF and the reflective layer RFL are made of an organic material, a dissolution reaction may occur by the organic material reacting with an organic material of the cover layer COL. In the embodiment, by disposing the protective layer PRL on a surface of the reflective layer RFL, it is possible to prevent the frame DF and the reflective layer RFL from being dissolved by the cover layer COL.

The protective layer PRL may include a polymer material to prevent the dissolution of the frame DF and the reflective layer RFL. The polymer material may include, for example, PET, acrylate, or an epoxy. In case that the cover layer COL is made of a silicone-based material, an acrylic-based material, or an epoxy-based material, the protective layer PRL is not dissolved by the cover layer COL, thereby preventing the frame DF and the reflective layer RFL from being dissolved by the cover layer COL.

Referring to FIG. 13, in a structure in which the frame DF includes an upper surface TS and a side surface SS, the reflective layer RFL may be disposed on the upper surface TS and the side surface SS of the frame DF. In order to protect the frame DF and the reflective layer RFL, the protective layer PRL may be disposed on the reflective layer RFL disposed on the upper surface TS and the side surface SS of the frame DF. For example, the protective layer PRL may be disposed on the upper surface TS and the side surface SS of the frame DF.

Accordingly, since the reflective layer RFL is formed on the upper surface TS and the side surface SS of the frame DF, and the protective layer PRL is formed on the reflective layer RFL, UV light is irradiated onto the entirety of the cover layer COL, thereby improving a curing rate of the cover layer COL and preventing the frame DF and the reflective layer RFL from being dissolved by the cover layer COL.

Figure 14:
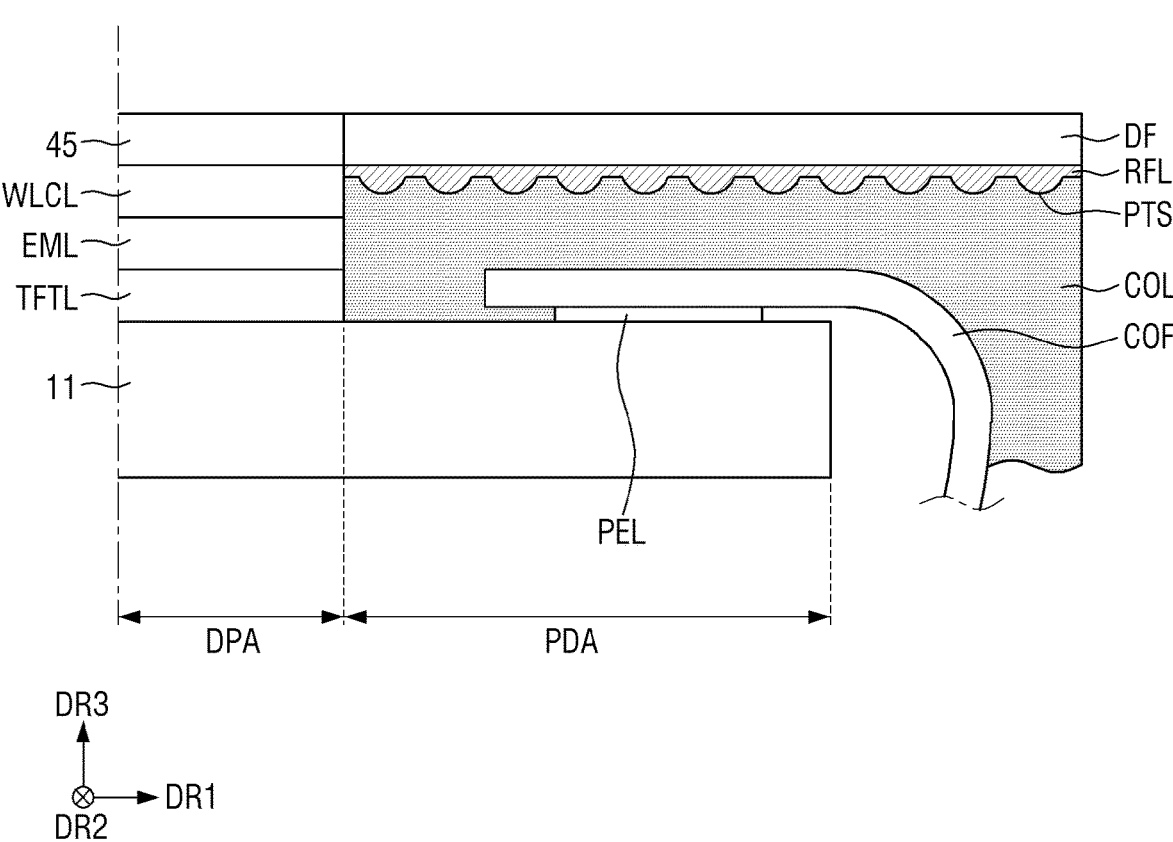
FIG. 14 is a schematic cross-sectional view illustrating a display device according to still another embodiment.
Figure 15:
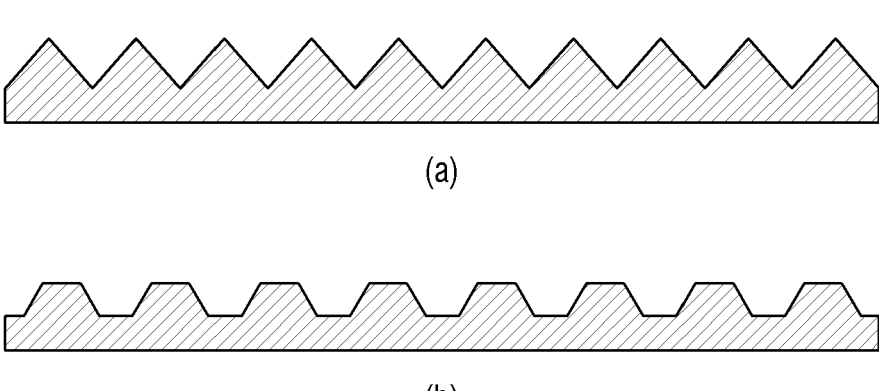
FIG. 15 shows schematic cross-sectional views illustrating a reflective layer of the display device according to still another embodiment.
Figure 16:
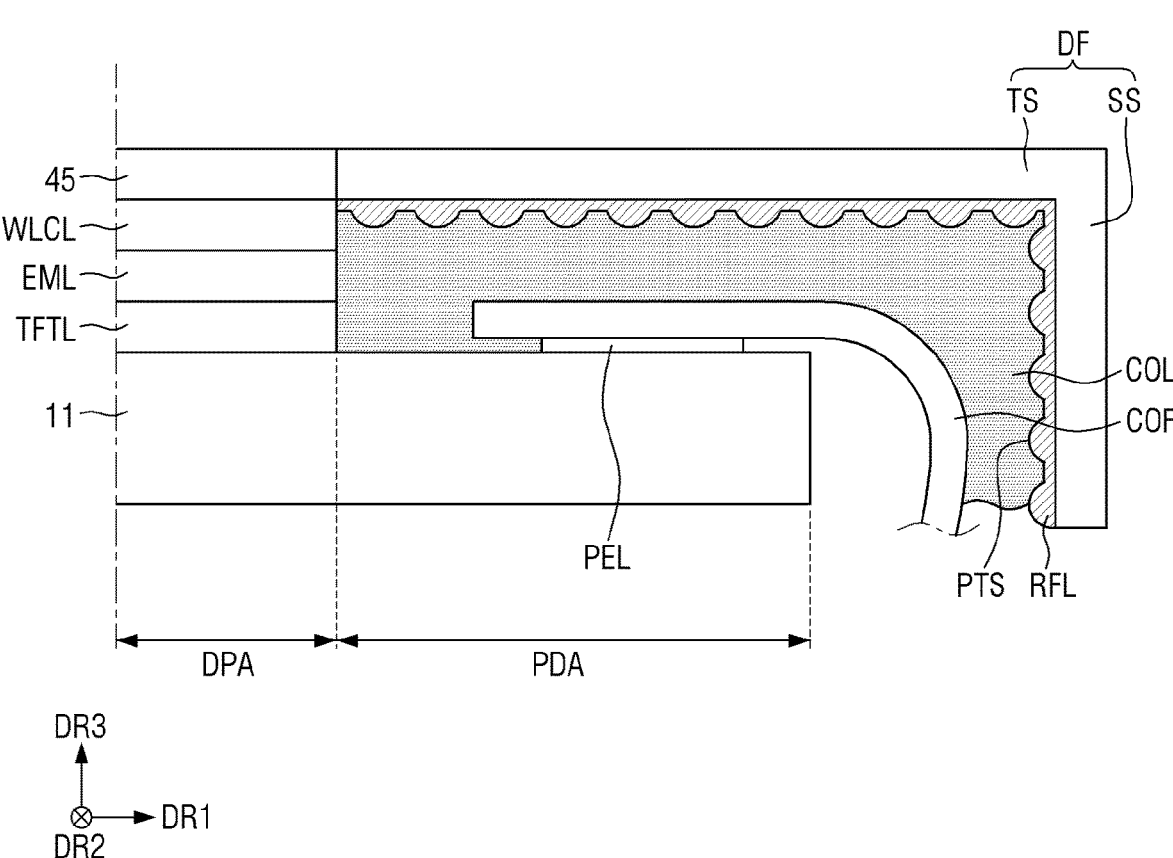
FIG. 16 is a schematic cross-sectional view illustrating the display device according to still another embodiment.

FIG. 14 is a schematic cross-sectional view illustrating a display device according to still another embodiment. FIG. 15 illustrates schematic cross-sectional views illustrating a reflective layer of the display device according to still another embodiment. FIG. 16 is a schematic cross-sectional view illustrating the display device according to still another embodiment.

Referring to FIGS. 14 to 16, the embodiment is different from the above-described embodiments of FIGS. 7 to 13 in that a reflective layer RFL includes a protrusion structure PTS. Hereinafter, descriptions of the same components as the above-described embodiment will be omitted, and differences will be described.

Although, in the above-described embodiments, the reflective properties of the material of the reflective layer RFL have been used, in the embodiment, the structural reflective properties of the reflective layer RFL may be used.

Specifically, the protrusion structure PTS may be included on a surface of the reflective layer RFL. The protrusion structure PTS may be disposed on a surface of the reflective layer RFL facing a substrate 11. A cross-sectional shape of the protrusion structure PTS may be a polygonal shape such as a semicircular shape, a triangular shape, or a trapezoidal shape.

As shown in FIG. 14, the cross-sectional shape of the protrusion structure PTS may be a semicircular shape. The protrusion structure PTS may be, for example, a microlens or a lenticular lens.

In an embodiment, as shown in FIG. 15, the cross-sectional shape of the protrusion structure PTS may be a triangular shape (see FIG. 15(*a*)). In addition, the cross-sectional shape of the protrusion structure PTS may be a trapezoidal shape (see FIG. 15(*b*)).

The reflective layer RFL may include a material having a refractive index different from that of a cover layer COL. In case that the reflective layer RFL and the cover layer COL have different refractive indices, UV light may be reflected due to a shape of the protrusion structure PTS at an interface between the protrusion structure PTS and the cover layer COL.

In the embodiment, since the reflective layer RFL includes the protrusion structure PTS, UV light is irradiated onto the entirety of the cover layer COL, thereby improving a curing rate of the cover layer COL.

In addition, referring to FIG. 16, in a structure in which a frame DF includes an upper surface TS and a side surface SS, the reflective layer RFL may be disposed on the upper surface TS and the side surface SS of the frame DF. UV light irradiated from a side surface of the substrate 11 may be reflected by the reflective layer RFL disposed on the side surface SS of the frame DF and the printed circuit board COF to reach the inside of the cover layer COL. In addition, in the inside of the cover layer COL, UV light may be reflected between the printed circuit board COF and the reflective layer RFL disposed on the upper surface TS of the frame DF to reach the entirety of the inside of the cover layer COL. Accordingly, by forming the reflective layer RFL on the upper surface TS and the side surface SS of the frame DF, UV light is irradiated onto the entirety of the cover layer COL, thereby improving the curing rate of the cover layer COL.

Figure 17:
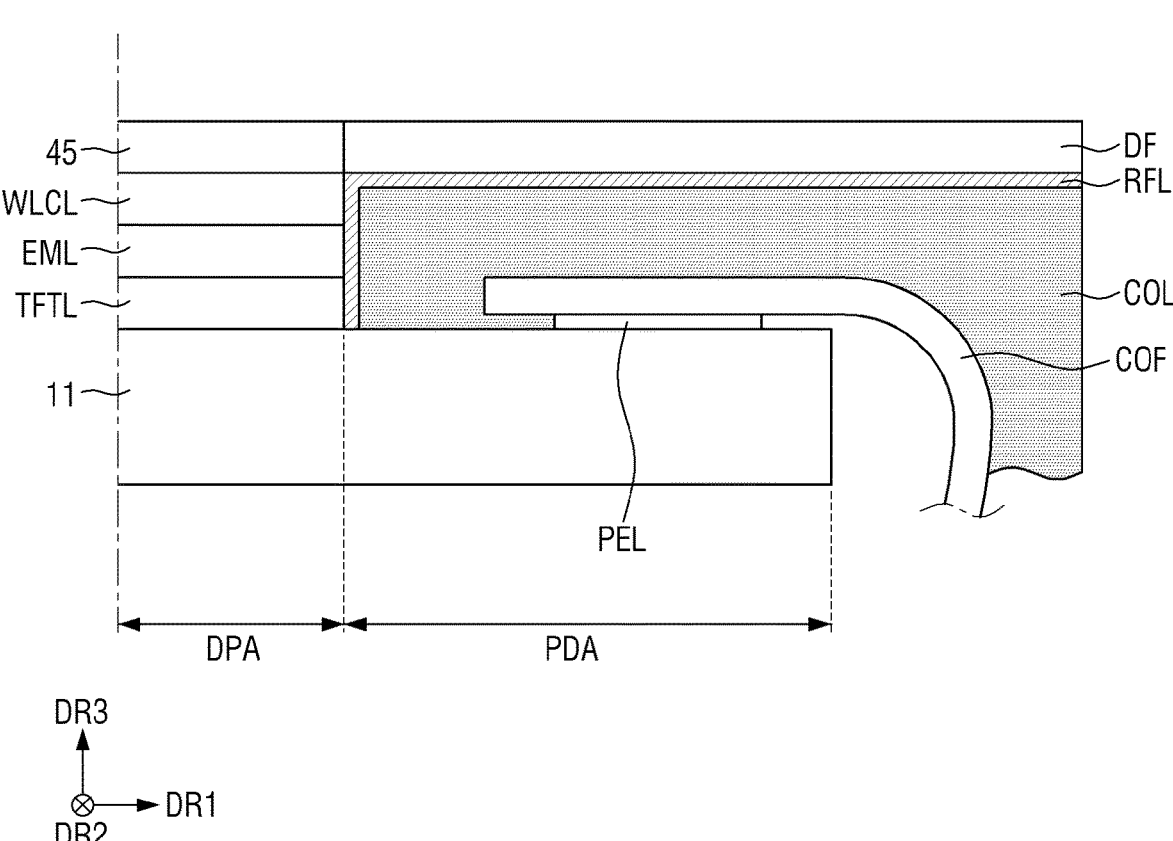
FIGS. 17 and 18 are schematic cross-sectional views illustrating a display device according to yet another embodiment.
Figure 18:
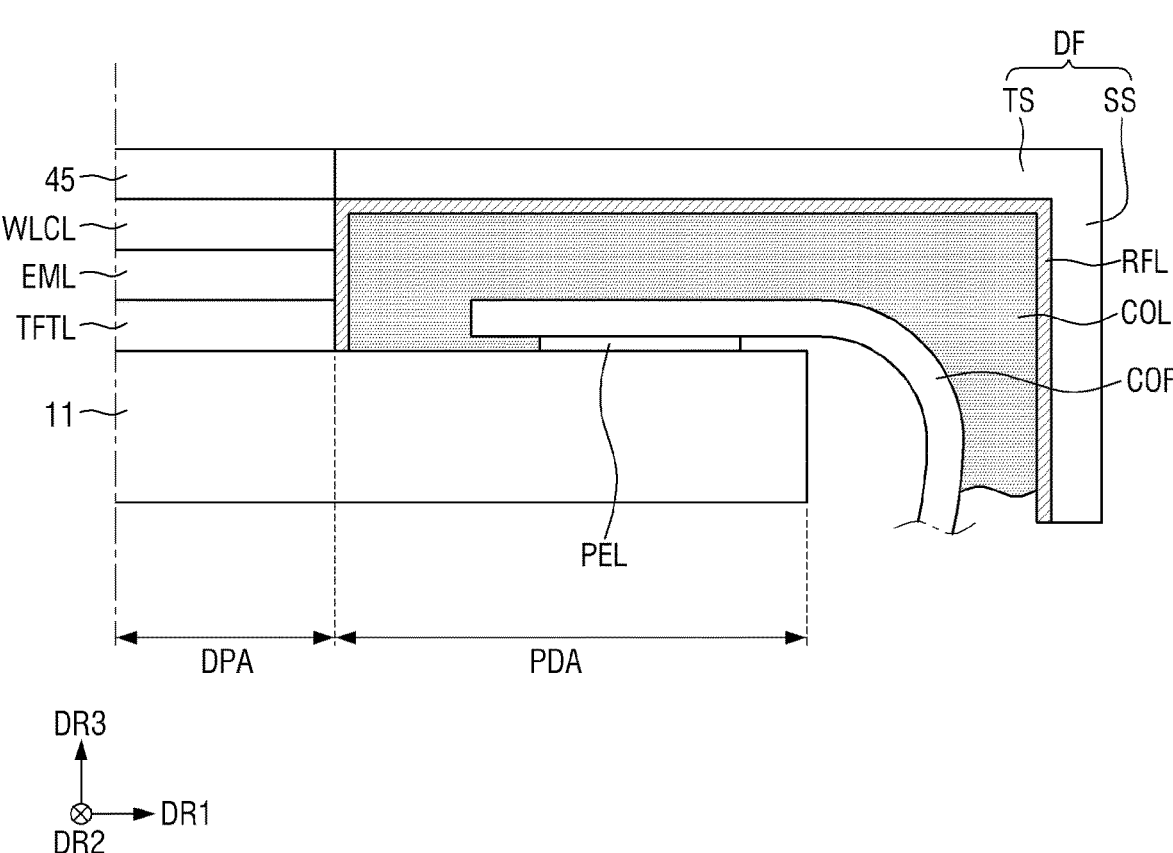

FIGS. 17 and 18 are schematic cross-sectional views illustrating a display device according to yet another embodiment.

Referring to FIGS. 17 and 18, the embodiment is different from the above-described embodiments of FIGS. 7 to 16 in that a reflective layer RFL is disposed to extend to side surfaces of a transistor layer TFTL, a light-emitting element layer EML, and a wavelength conversion layer WLCL. Hereinafter, descriptions of the same components as the above-described embodiment will be omitted, and differences will be described.

The reflective layer RFL may be disposed on a surface of a frame DF and may be disposed to extend to the side surfaces of the transistor layer TFTL, the light-emitting element layer EML, and the wavelength conversion layer WLCL. Specifically, the reflective layer RFL may contact the surface of the frame DF, the side surface of the transistor layer TFTL, the side surface of the light-emitting element layer EML, and the side surface of the wavelength conversion layer WLCL. However, the disclosure is not limited thereto, and the reflective layer RFL may contact at least one of the side surface of the transistor layer TFTL, the side surface of the light-emitting element layer EML, and the side surface of the wavelength conversion layer WLCL. In addition, the reflective layer RFL may extend to a substrate 11 to contact an upper surface of the substrate 11.

In this case, UV light irradiated to cure the cover layer COL may be reflected and re-reflected by the reflective layer RFL disposed on an inner side of the cover layer COL, for example, disposed on the side surface of the transistor layer TFTL, the side surface of the light-emitting element layer EML, and the side surface of the wavelength conversion layer WLCL. Accordingly, UV light is irradiated onto the entirety of the cover layer COL, thereby improving a reflectance of the cover layer COL.

Figure 19:
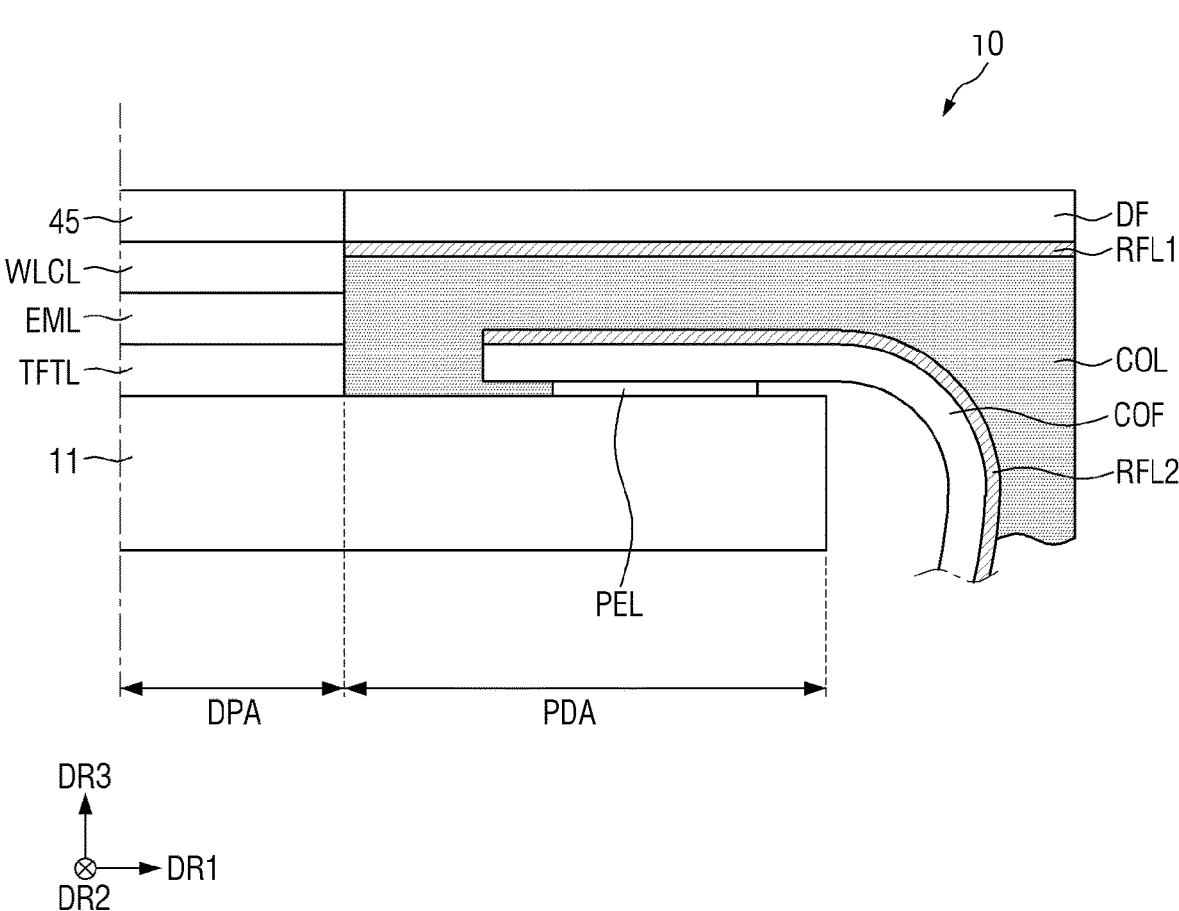
FIG. 19 is a schematic cross-sectional view illustrating a display device according to yet another embodiment.

FIG. 19 is a schematic cross-sectional view illustrating a display device according to yet another embodiment.

Referring to FIG. 19, the embodiment is different from the above-described embodiments of FIGS. 7 to 18 in that a first reflective layer RFL1 is disposed on a surface of a frame DF and a second reflective layer RFL2 is disposed on a surface of a printed circuit board COF. Hereinafter, descriptions of the same components as the above-described embodiment will be omitted, and differences will be described.

The first reflective layer RFL1 may be disposed on a surface of the frame DF, and the second reflective layer RFL2 may be disposed on a surface of the printed circuit board COF. Since the first reflective layer RFL1 is the same as that of the above-described embodiments, descriptions thereof will be omitted.

The second reflective layer RFL2 may be disposed directly on a surface of the printed circuit board COF, for example, on an upper surface of the printed circuit board COF facing the frame DF. Although the printed circuit board COF itself exhibits a reflectance of about 40%, in the embodiment, the second reflective layer RFL2 may be formed on a surface of the printed circuit board COF to further increase the reflectance.

FIG. 19 illustrates an example in which the second reflective layer RFL2 is disposed on the upper surface of the printed circuit board COF, but the disclosure is not limited thereto. In an embodiment, the second reflective layer RFL2 may also be disposed on a side surface of the printed circuit board COF facing a side surface of a transistor layer TFTL.

In the embodiment, UV light irradiated from a side surface of a substrate 11 may be reflected by the first reflective layer RFL1 disposed on the frame DF and the second reflective layer RFL2 disposed on the printed circuit board COF to reach the inside of a cover layer COL. Accordingly, UV light is irradiated onto the entirety of the cover layer COL, thereby improving a curing rate of the cover layer COL.

Figure 20:
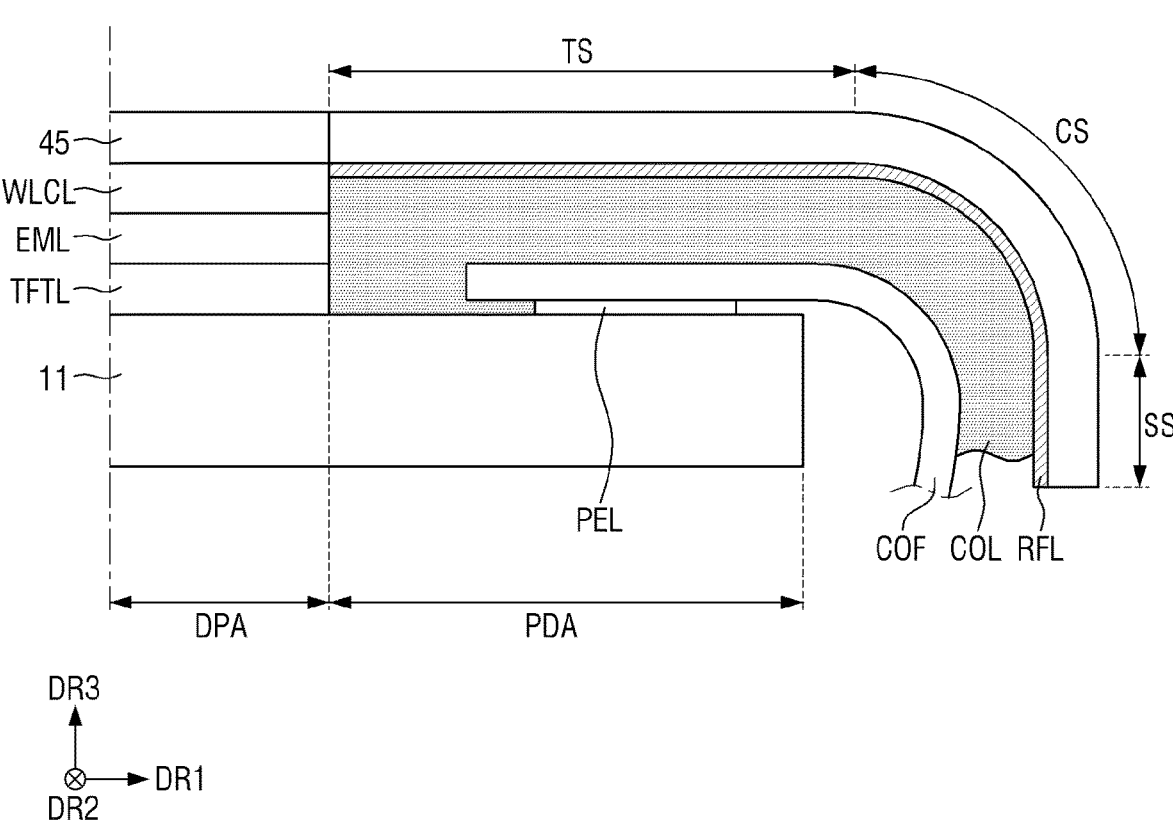
FIGS. 20 and 21 are schematic cross-sectional views illustrating a display device according to yet another embodiment.
Figure 21:
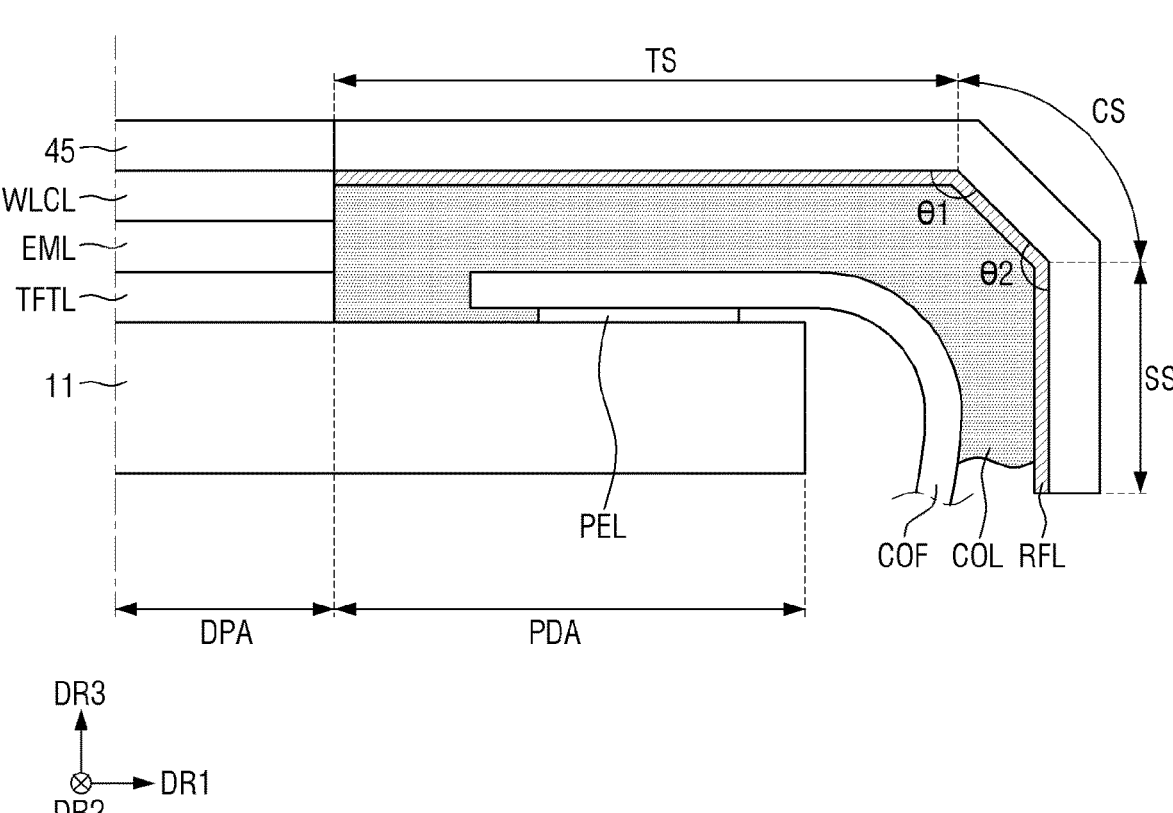

FIGS. 20 and 21 are schematic cross-sectional views illustrating a display device according to yet another embodiment.

Referring to FIGS. 20 and 21, the embodiment is different from the above-described embodiments of FIGS. 7 to 19 in that a corner CS formed by an upper surface TS and a side surface SS of a frame DF is round or forms obtuse angles.

Hereinafter, descriptions of the same components as the above-described embodiment will be omitted, and differences will be described.

The frame DF may include the upper surface TS and the side surface SS and may further include the corner CS between the upper surface TS and the side surface SS. The corner CS may be formed in a round shape. In case that the corner CS is formed in the round shape, a reflected angle of UV light irradiated to cure a cover layer COL is further refracted to allow the UV light to reach an inner side of the cover layer COL.

In addition, the corner CS may form the obtuse angles. As shown in FIG. 21, a first angle θ1 between the upper surface TS and the corner CS and a second angle θ2 between the side surface SS and the corner CS may be formed as the obtuse angles. In case that the corner CS has the obtuse angles, a reflected angle of UV light irradiated to cure the cover layer COL is further refracted to allow the UV light to reach the inner side of the cover layer COL.

Accordingly, UV light can reach the entirety of the cover layer COL so that a curing rate of the cover layer COL can be improved.

Hereinafter, a method of manufacturing the above-described display device will be described.

FIGS. 22 to 28 are schematic cross-sectional views illustrating operations of a method of manufacturing a display device according to an embodiment.

FIGS. 22 to 28 may correspond to the above-described display device shown in FIG. 8. In the following description of the method of manufacturing a display device, since the material of each of layers have been described above, descriptions thereof will be omitted.

Figure 22:
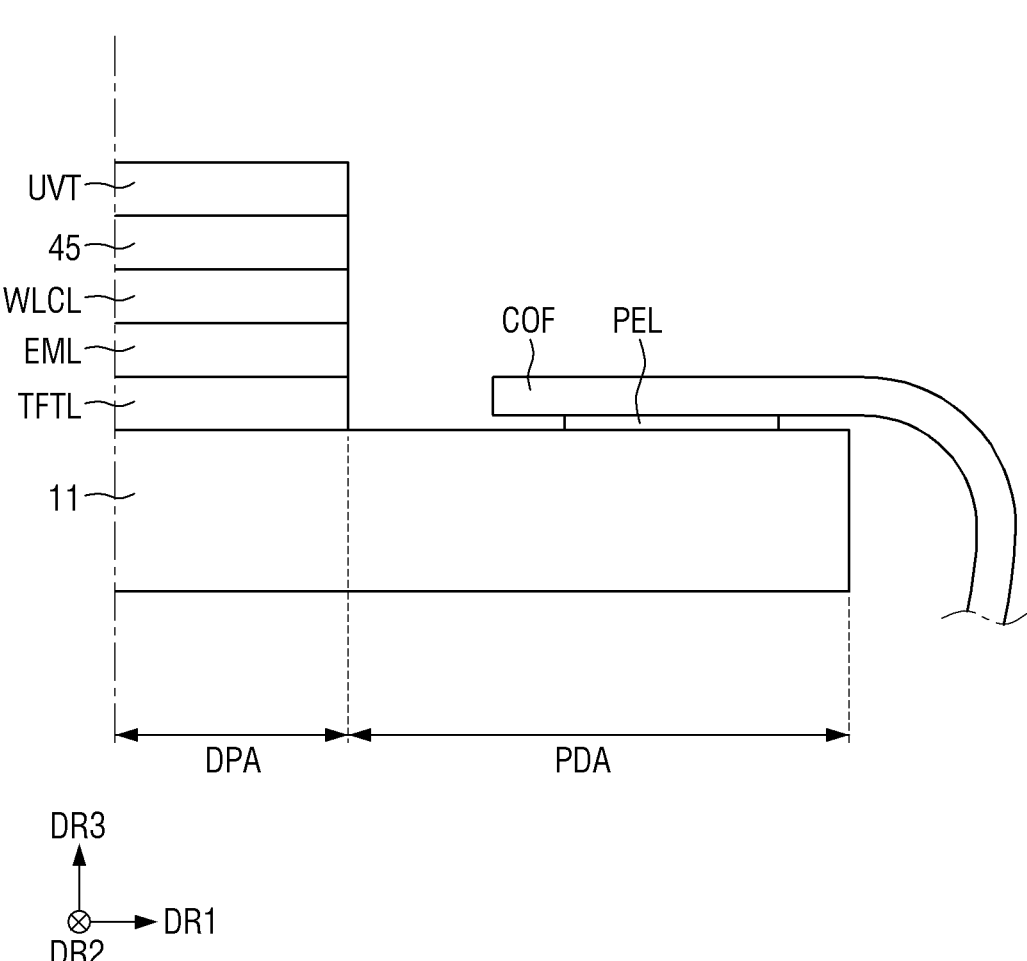
FIGS. 22 to 28 are schematic cross-sectional views illustrating operations of a method of manufacturing a display device according to an embodiment.

First, referring to FIG. 22, a transistor layer TFTL, a light-emitting element layer EML, a wavelength conversion layer WLCL, and an anti-reflection member 45 are formed on a substrate 11. A printed circuit board COF is coupled to a pad electrode layer PEL of a pad part PDA of the substrate 11.

Then, UV tape UVT is attached to the anti-reflection member 45. The UV tape UVT may serve to temporarily attach and fix the anti-reflection member 45, disposed on the substrate 11, to a mold MD to be described below. In case that the anti-reflection member 45 is fixed to the mold MD with (or through) the UV tape UVT, the entirety of the substrate 11 may be fixed to the mold MD. The UV tape UVT may act as adhesive tape for fixing the anti-reflection member 45 and the mold MD, and in case that UV light is irradiated, the UV tape UVT may exhibit a release function so that the anti-reflection member 45 and the mold MD may be readily detached.

Figure 23:
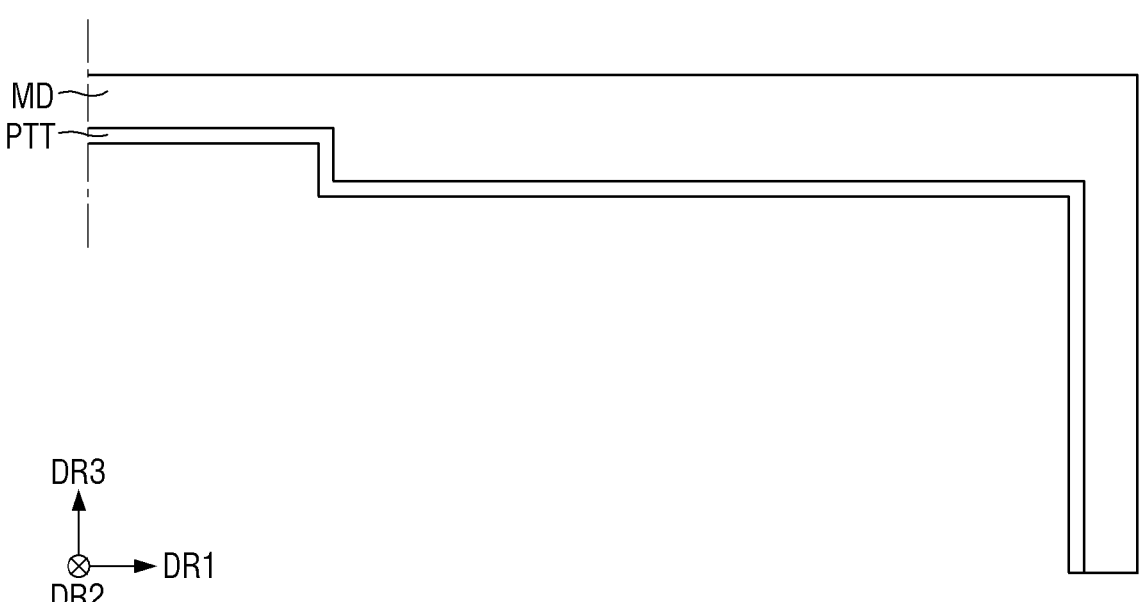

Referring to FIG. 23, the mold MD is provided. Stepped portions may be formed on a surface of the mold MD so as to correspond to the above-described structure of the substrate 11. The mold MD may be made of a plastic or metal material. Although an example of the mold MD has been described in the embodiment, a stage may be used instead of the mold MD.

A release layer PTT is formed on a surface of the mold MD. Specifically, the release layer PTT is formed by coating a surface of the mold MD with an F-based resin. The release layer PTT may serve to facilitate adhesion to and detachment from a surface of the mold MD.

Figure 24:
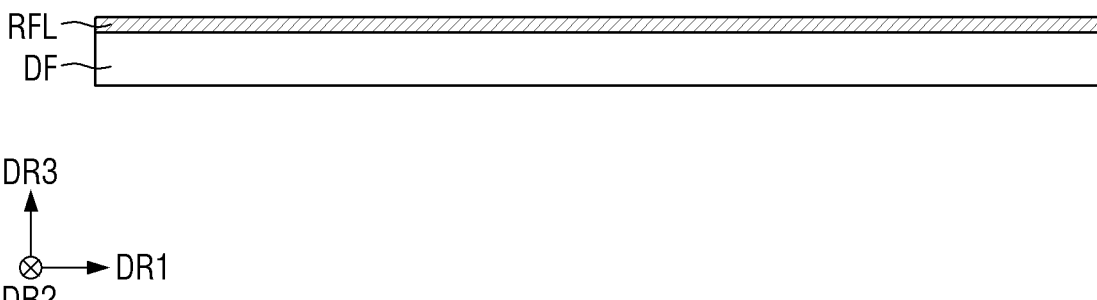

Referring to FIG. 24, a frame DF is provided. The frame DF may be tape that includes a polymer including a black dye. A reflective layer RFL is formed on a surface of the frame DF. The reflective layer RFL may be formed by a method such as a sputtering, deposition, or coating method.

Figure 25:
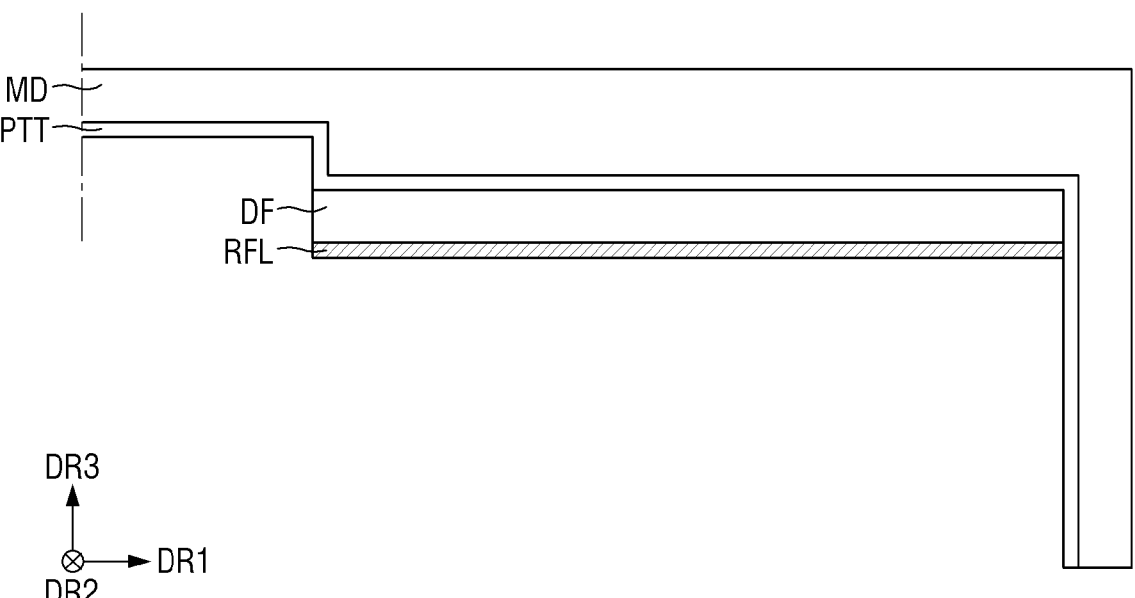

Referring to FIG. 25, the frame DF on which the reflective layer RFL is formed is seated on a surface of the mold MD. In this case, the frame DF is disposed on the mold MD such that the reflective layer RFL faces outward. The frame DF may be temporarily seated without being attached and fixed to the mold MD.

Figure 26:
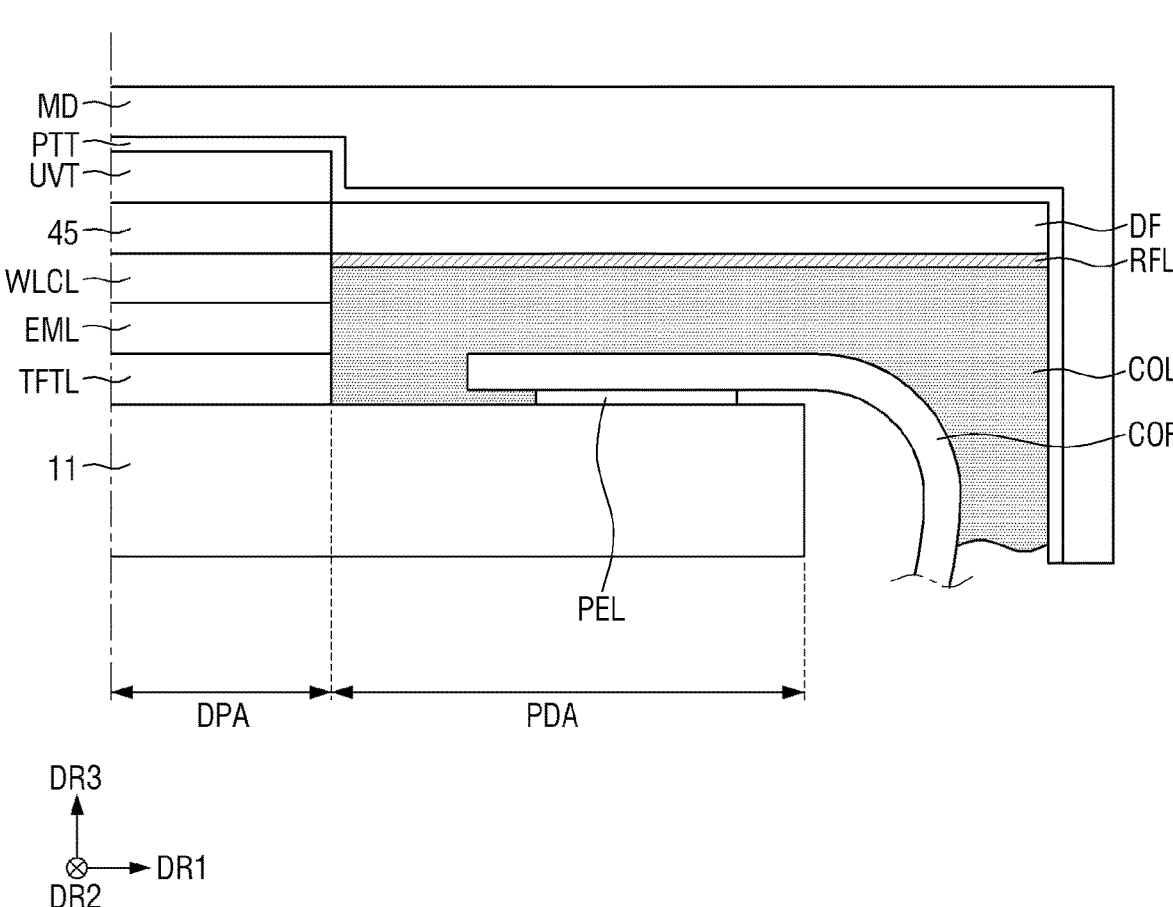

Referring to FIG. 26, a display device 10, which is manufactured in advance, is attached to the mold MD. Specifically, the UV tape UVT of the display device 10 and the release layer PTT of the mold MD may be attached so that the display device 10 and the mold MD may be coupled to each other. Although FIG. 26 illustrates that the display device 10 is disposed below the mold MD and the mold MD is disposed on the display device 10 to couple the display device 10 and the mold MD to each other, the disclosure is not limited thereto, and the mold MD may be disposed below the display device 10 to couple the display device 10 and the mold MD to each other.

Figure 27:
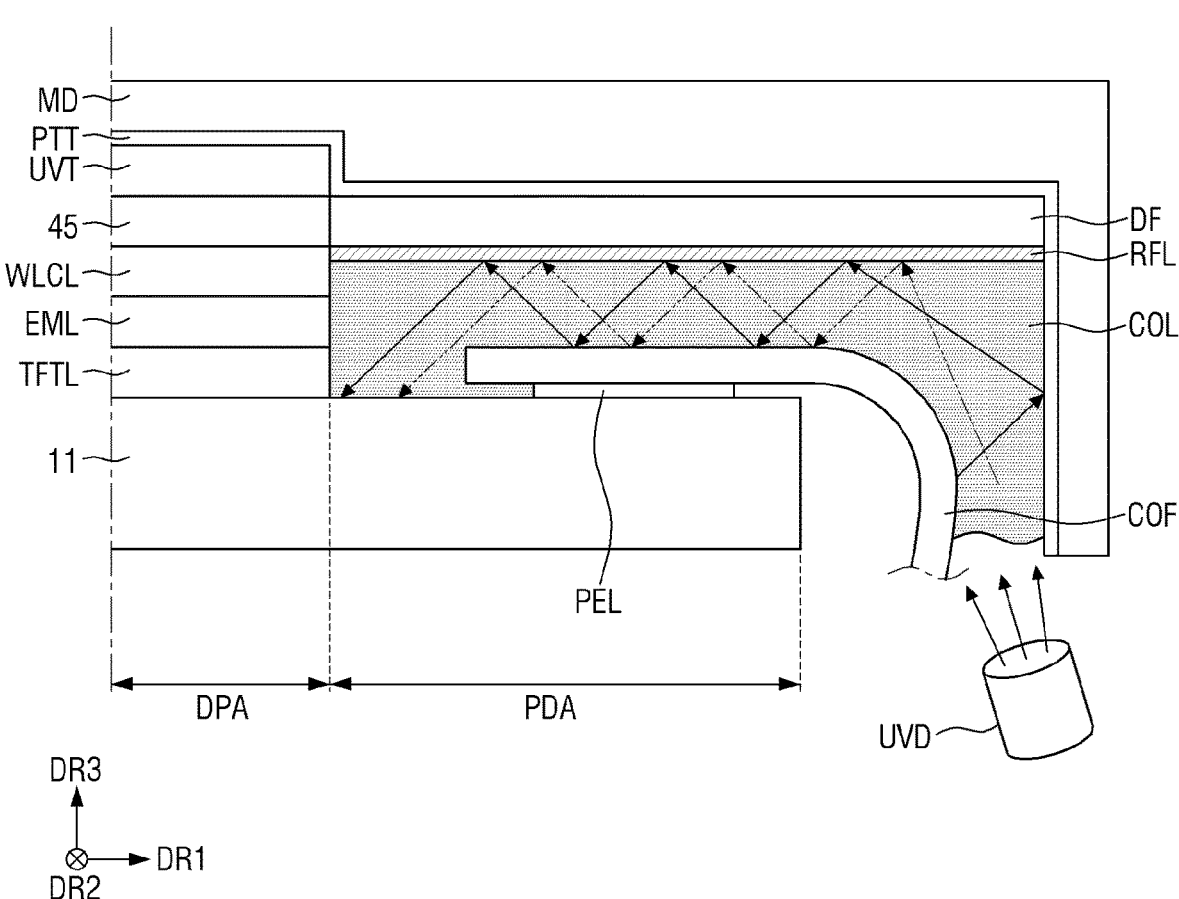

Referring to FIG. 27, a cover layer material is applied to a space between the printed circuit board COF and the mold MD. The cover layer material may be applied by a method such as a coating or dispensing method.

Next, UV light is irradiated from a side surface of the substrate 11 at the cover layer material disposed in the space between the printed circuit board COF and the mold MD through a UV light irradiator UVD. UV light may travel by being reflected between the printed circuit board COF and the mold MD and may reach the entirety of the cover layer material by being reflected between the reflective layer RFL disposed on a surface of the frame DF and the printed circuit board COF. The UV light may be irradiated for several tens of seconds to several tens of minutes and may be irradiated sufficiently to completely cure the cover layer material. Accordingly, a cover layer COL may be formed, and the frame DF and the substrate 11 may be coupled by the cover layer COL.

Figure 28:
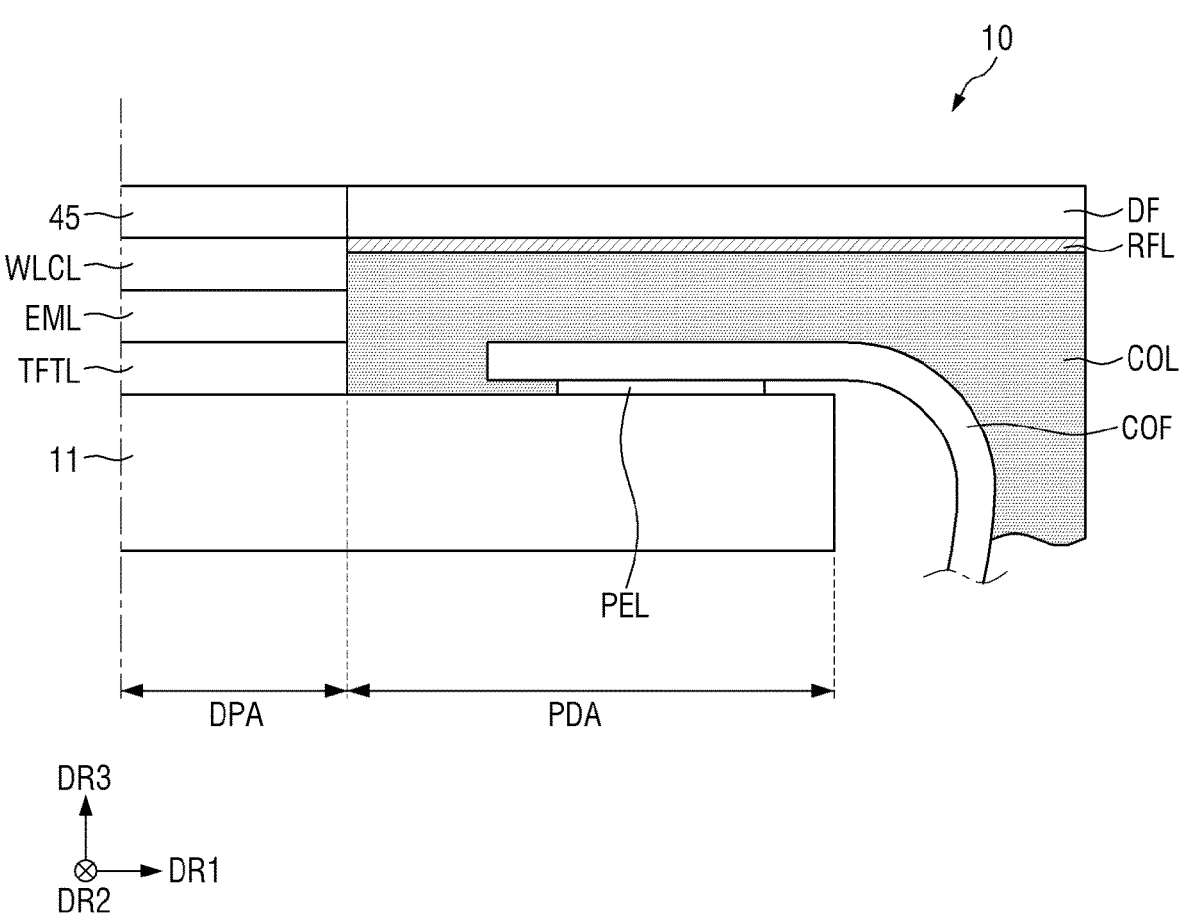

Referring to FIG. 28, UV light may be irradiated onto the UV tape UVT, and then, the mold MD may be detached from the display device 10, thereby manufacturing the display device 10 of the disclosure. As described above, since the UV tape UVT exhibits release properties in case that UV light is irradiated, the UV tape UVT can be readily detached from the display device 10. Accordingly, the mold MD attached by the UV tape UVT may be separated from the display device 10.

As described above, in a display device and a method of manufacturing the same according to embodiments, since a reflective layer RFL is formed on a surface of a frame DF, UV light can reach the entirety of a cover layer COL, thereby preventing the non-curing of the cover layer COL. Accordingly, it is possible to enhance a delamination force between a printed circuit board COF and a pad part PDA and prevent moisture permeation from occurring.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a printed circuit board attached to a side of a substrate;
a frame facing the printed circuit board;
a cover layer disposed between the substrate and the frame and overlapping the printed circuit board in a plan view; and
a first reflective layer disposed on a surface of the frame and disposed between the frame and the cover layer.

2. The display device of claim 1, wherein the first reflective layer includes at least one selected from among an organic material, an inorganic material, and a metal.

3. The display device of claim 1, wherein the first reflective layer has a multi-layered structure in which a high refractive index layer and a low refractive index layer are alternately and repeatedly stacked.

4. The display device of claim 1, wherein the first reflective layer includes a plurality of protrusion structures disposed on a surface of the first reflective layer contacting the cover layer.

5. The display device of claim 4, wherein a cross-sectional shape of the plurality of protrusion structures is a semicircular shape, a triangular shape, or a trapezoidal shape.

6. The display device of claim 1, wherein the first reflective layer has a thickness of about 20 nm to about 1,000 nm.

7. The display device of claim 1, wherein the cover layer includes an ultraviolet (UV)-curable material.

8. The display device of claim 1, wherein a space defined by the substrate, the frame, and the printed circuit board is filled with the cover layer.

9. The display device of claim 1, wherein a cross-sectional shape of the frame in a direction perpendicular to a length direction of the frame is a bar shape.

10. The display device of claim 1, wherein:
the frame includes:
an upper surface parallel to the substrate; and
a side surface bent in a direction intersecting the upper surface; and
the first reflective layer is disposed on the upper surface and the side surface of the frame.

11. The display device of claim 1, further comprising:
a protective layer disposed on a surface of the first reflective layer and disposed between the first reflective layer and the cover layer.

12. The display device of claim 1, further comprising:
a second reflective layer disposed on a surface of the printed circuit board which faces the frame.

13. A method of manufacturing the display device of claim 1, the method comprising:
forming the substrate to which the printed circuit board is attached and attaching ultraviolet (UV) tape to the substrate;

forming a mold in which a release layer is formed on a surface of the mold;
forming the frame in which the reflective layer is formed on the surface of the frame;
disposing the frame on the release layer of the mold;
attaching the mold to the substrate with the UV tape;
applying a cover layer material between the substrate and the frame and irradiating UV light to form the cover layer; and
detaching the mold from the substrate.

14. The method of claim 13, wherein
the cover layer is formed by being cured with the UV light; and
the frame and the substrate are connected by the cover layer.

15. The method of claim 13, wherein the detaching of the mold includes irradiating the UV light onto the UV tape and then detaching the mold from the substrate.

16. A display device comprising:
a display area and a pad part;
a transistor layer, a light-emitting element layer, a wavelength conversion layer, and an anti-reflection member which are disposed in the display area on a substrate;
a printed circuit board attached in the pad part to the substrate;
a frame facing the printed circuit board;
a cover layer disposed between the substrate and the frame and overlapping the printed circuit board in a plan view; and
a first reflective layer disposed on a surface of the frame and disposed between the frame and the cover layer.

17. The display device of claim 16, wherein:
the light-emitting element layer is disposed on the transistor layer;
the wavelength conversion layer is disposed on the light-emitting element layer;
the anti-reflection member is disposed on the wavelength conversion layer; and
the cover layer contacts at least one of the transistor layer, the light-emitting element layer, the wavelength conversion layer, and the anti-reflection member.

18. The display device of claim 16, wherein the frame contacts a side surface of the anti-reflection member.

19. The display device of claim 16, wherein the first reflective layer contacts at least one of the transistor layer, the light-emitting element layer, and the wavelength conversion layer.

20. The display device of claim 19, wherein the first reflective layer extends to the substrate and contacts an upper surface of the substrate.

* * * * *